United States Patent
Tsurumaru

(10) Patent No.: US 10,211,824 B2
(45) Date of Patent: Feb. 19, 2019

(54) DRIVE CONTROL CIRCUIT DRIVING A SEMICONDUCTOR DEVICE FOR POWER CONVERSION

(71) Applicant: Renesas Electronics Corporation, Tokyo (JP)

(72) Inventor: Makoto Tsurumaru, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/795,132

(22) Filed: Oct. 26, 2017

(65) Prior Publication Data
US 2018/0159521 A1  Jun. 7, 2018

(30) Foreign Application Priority Data
Dec. 7, 2016  (JP) .................... 2016-237423

(51) Int. Cl.
*H03K 17/08* (2006.01)
*H03K 17/082* (2006.01)
(Continued)

(52) U.S. Cl.
CPC .......... *H03K 17/0828* (2013.01); *H02M 1/08* (2013.01); *H02M 7/5395* (2013.01); *H02M 7/53875* (2013.01); *H02P 27/08* (2013.01); *H03K 17/127* (2013.01); *H03K 17/166* (2013.01); *H02M 2001/0009* (2013.01)

(58) Field of Classification Search
CPC ........ H02H 3/083; H02H 3/087; H02H 3/105; H03K 3/021; H03K 17/0822; H03K 17/0826; H03K 17/0828; H03K 17/14
See application file for complete search history.

(56) References Cited

U.S. PATENT DOCUMENTS 5,485,341 A * 1/1996 Okado ............... H03K 17/0822
                                            361/79
5,710,508 A * 1/1998 Watanabe .......... H03K 17/0828
                                            323/284
(Continued)

FOREIGN PATENT DOCUMENTS

JP     2014-150701 A      8/2014
JP     2014-230307 A      12/2014

OTHER PUBLICATIONS

Extended European Search Report dated Jul. 25, 2018 in European Application No. 17204313.5.

*Primary Examiner* — An T Luu
(74) *Attorney, Agent, or Firm* — McGinn I.P. Law Group, PLLC

(57) ABSTRACT

A semiconductor device includes a drive control circuit which drives a gate terminal of an IGBT. The drive control circuit includes a state machine control circuit, a base data memory and a current drive circuit which drives the IGBT on the basis of driving current information stored in the base data memory. The state machine control circuit reads out driving current information for rising stored in the base data memory a plurality of times in a predetermined time period and drives the current drive circuit at rising of a PWM signal, and reads out driving current information for falling stored in the base data memory a plurality of times in a predetermined time period and drives the current drive circuit at falling of the PWM signal.

16 Claims, 40 Drawing Sheets

(51) Int. Cl.
*H02P 27/08* (2006.01)
*H02M 1/08* (2006.01)
*H02M 7/5395* (2006.01)
*H03K 17/12* (2006.01)
*H03K 17/16* (2006.01)
*H02M 7/5387* (2007.01)
*H02M 1/00* (2006.01)

(56) References Cited

U.S. PATENT DOCUMENTS

| | | | |
|---|---|---|---|
| 6,717,785 B2 * | 4/2004 | Fukuda | H03K 17/0828 361/86 |
| 9,094,010 B2 | 7/2015 | Murata et al. | |
| 9,835,658 B2 * | 12/2017 | Tsurumaru | G01R 19/165 |
| 2013/0229209 A1 | 9/2013 | Miyauchi et al. | |

\* cited by examiner

FIG. 9

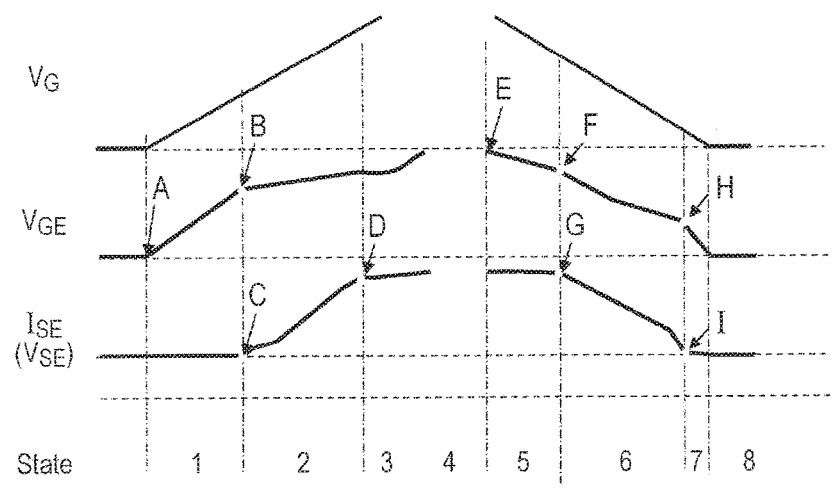

FIG. 10

| State NO. | STATES |
|---|---|
| 1 | STATE OF CHARGING GATE CIRCUIT CAPACITY |
| 2 | STATE OF TRANSITIONING TO ON-STATE AFTER COMPLETION OF CHARGING |
| 3 | STATE DIRECTLY BEFORE SATURATION STATE |
| 4 | ON-STATE SATURATION STATE |
| 5 | STATE OF DISCHARGING GATE CIRCUIT CAPACITY |
| 6 | STATE OF TRANSITIONING TO OFF-STATE AFTER COMPLETION OF DISCHARGING |
| 7 | STATE DIRECTLY BEFORE OFF-STATE |
| 8 | OFF-STATE SATURATION STATE |

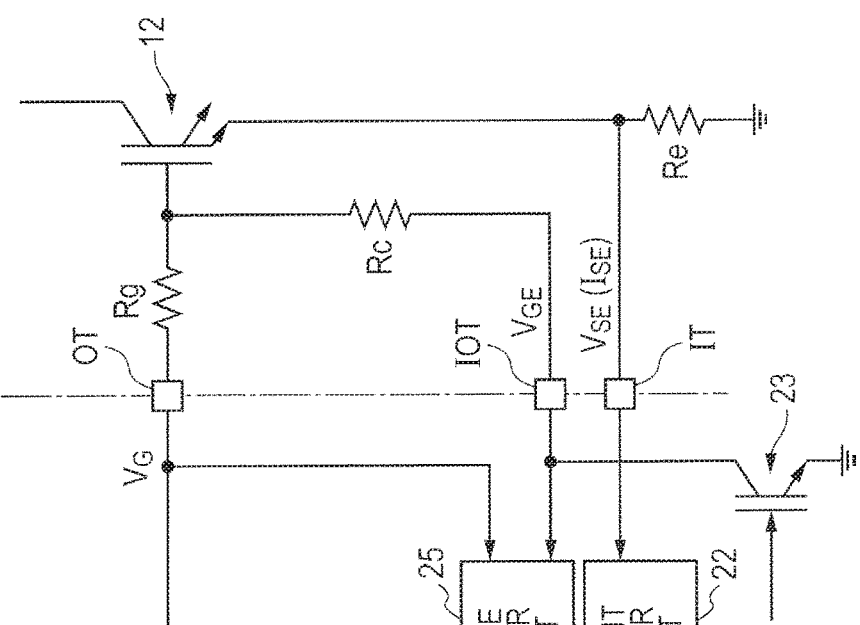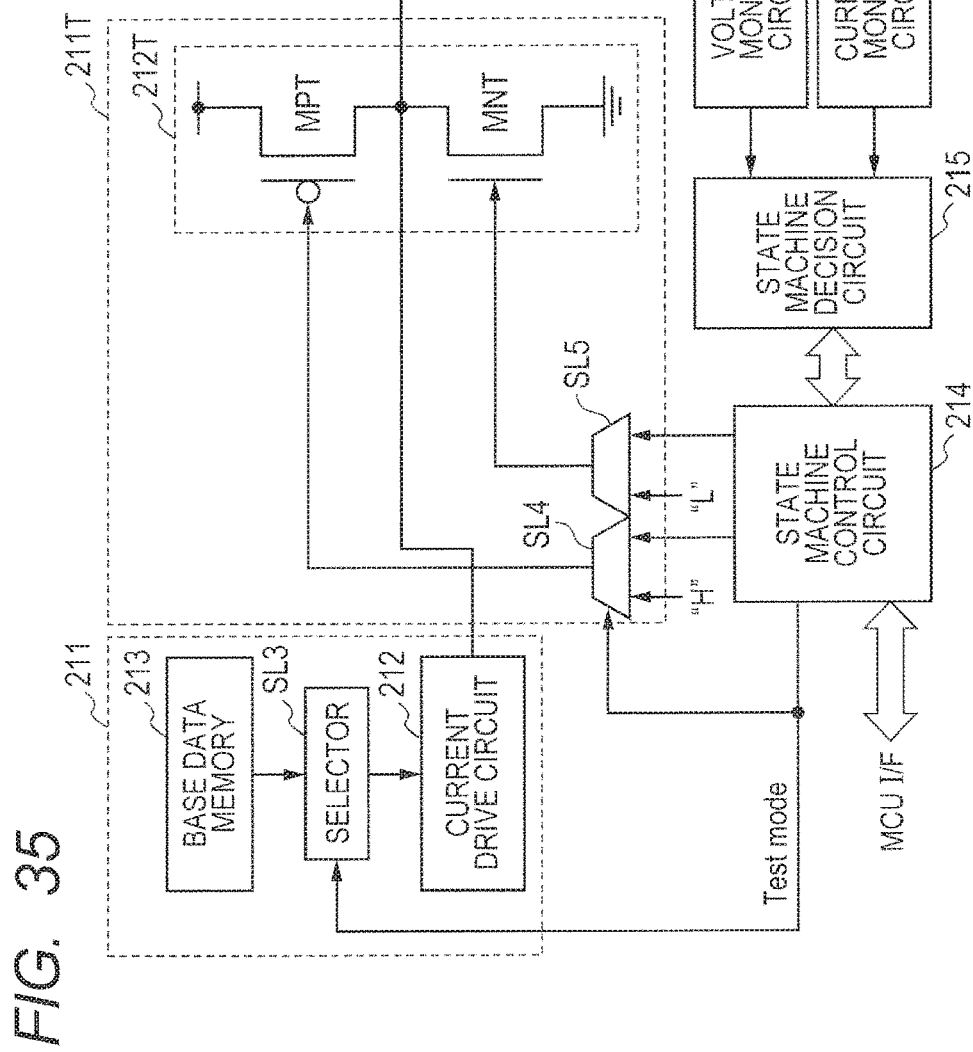
FIG. 35

FIG. 43

| Address | High side | Low side | IGBT State |
|---|---|---|---|
| 0 | 000000 | 000000 | State1(0) |
| 1 | 000000 | 000000 | State1(1) |
| 2 | 000000 | 000000 | State1(2) |
| ... | 000000 | 000000 | |
| L-1 | 000000 | 000000 | State1(Last) |
| L | 110000 | 000000 | State2(0) |
| L+1 | 110000 | 000000 | State2(1) |
| L+2 | 110000 | 000000 | State2(2) |
| ... | 110000 | 000000 | |
| M-1 | 110000 | 000000 | State2(Last) |
| M | 000000 | 000000 | State3(0) |
| M+1 | 000000 | 000000 | State3(1) |
| ... | 000000 | 000000 | |
| N(Last)-2 | 111100 | 000000 | State3(Last-2) |
| N(Last)-1 | 111101 | 000000 | State3(Last-1) |
| N(Last) | 111110 | 000000 | State3(Last) |

DRIVE CONTROL CIRCUIT DRIVING A SEMICONDUCTOR DEVICE FOR POWER CONVERSION

CROSS-REFERENCE TO RELATED APPLICATIONS

The disclosure of Japanese Patent Application No. 2016-237423 filed on Dec. 7, 2016 including the specification, drawings and abstract is incorporated herein by reference in its entirety.

BACKGROUND

The present disclosure relates to a semiconductor device and a power conversion apparatus equipped with the semiconductor device and is applicable to the semiconductor device which controls, for example, gate terminals of insulated gate bipolar transistors (IGBTs) which are coupled in parallel with one another.

In a power conversion apparatus which performs power conversion by switchingly driving power semiconductor elements and power semiconductor modules such as the IGBTs, MOS-FETs and so forth, for example, the plurality of IGBTs are arranged in parallel with one another, these IGBTs are switchingly driven simultaneously and thereby an output current capacity (a converted power capacity) thereof is increased (for example, Japanese Unexamined Patent Application Publication No. 2014-230307 and Japanese Unexamined Patent Application Publication No. 2014-150701).

SUMMARY

Operations of power semiconductor elements (semiconductor devices for power) in a transition period of a switching operation are different from one another due to a variation in characteristic between/among the power semiconductor elements.

Other matters to be solved and novel features of the present disclosure will become apparent from description of the specification and the appended drawings.

A summary of representative elements of the present disclosure will be briefly described as follows.

That is, a semiconductor device according to one embodiment of the disclosure includes a drive control circuit which drives a semiconductor device for power. The drive control circuit includes a waveform generation circuit which is capable of optionally generating a gate signal according to the characteristic of the semiconductor device for power to be coupled.

According to the above-mentioned semiconductor device, it is possible to optionally set states of the semiconductor devices for control in the transition period of the switching operation.

BRIEF DESCRIPTION OF THE DRAWINGS

FIG. 9 is a waveform diagram illustrating one example of a state of an IGBT, corresponding to the RWM signal waveform diagram in FIG. 8.

FIG. 10 is a diagram illustrating one example of the states of the IGBT in FIG. 9.

FIG. 35 is a block diagram illustrating one example of a configuration of a drive control circuit according to a modified example 4.

FIG. 43 is a diagram illustrating one drive control example using data in the base data memory.

DETAILED DESCRIPTION

In the following, practical examples and an embodiment of the present disclosure will be described using the drawings. However, in the following description, there are cases where the same symbols are assigned to the same constitutional elements and repetitive description thereof is omitted.

An electric motor (motor) is used as a power source of a hybrid electric vehicle (HEV) which is combined with an internal combustion engine (a petrol engine), an electric vehicle (EV) and so forth. When driving the electric motor, a power conversion apparatus (an inverter circuit) which performs DC-to-AC conversion is used to obtain a predetermined torque and a predetermined power source frequency.

A semiconductor device for driving which drives a semiconductor device for power and a semiconductor device for control which controls the semiconductor device for driving are used in the inverter circuit other than the semiconductor device for power such as an IGBT and so forth. The semiconductor device for driving has an overcurrent protection function for protecting the semiconductor device for power against destruction due to the overcurrent and so forth other than a gate drive circuit which drives the semiconductor device for power.

As methods of increasing a driving current of the IGBT for increasing a motor drive capability, there are (1) a method of increasing a chip size and (2) a method of coupling the plurality of IGBTs in parallel with one another. However, selection of the method (2) is preferable because a limit occurs in the method (1) from the viewpoint of a proper value of the chip size and for reducing an on-resistance.

COMPARATIVE EXAMPLE

Figure 1:
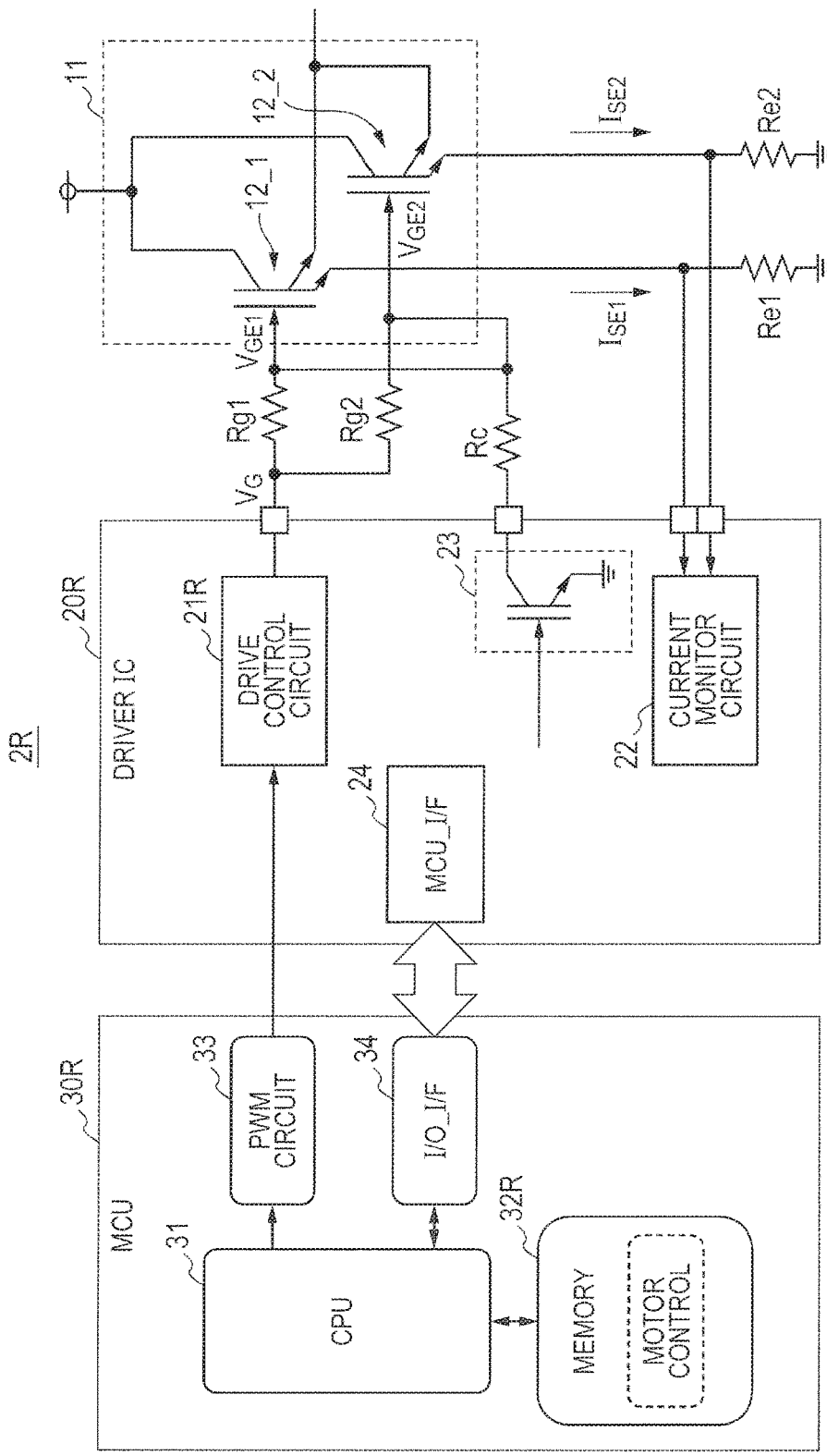
FIG. 1 is a block diagram illustrating one example of a configuration of a power conversion apparatus according to a comparative example.
Figure 2:
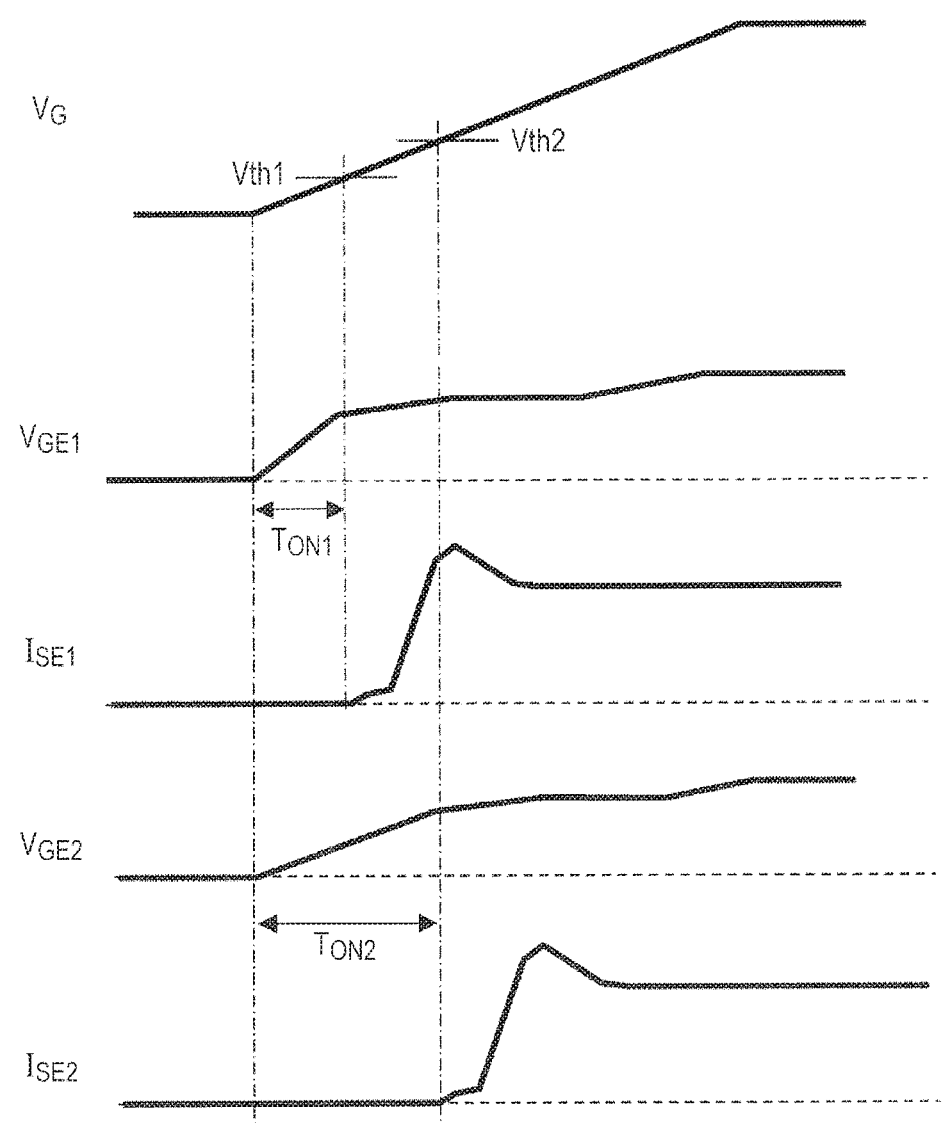
FIG. 2 is a voltage and current waveform diagram for describing issues of the power conversion apparatus in FIG. 1.

First, a power conversion apparatus according to the technology (a comparative example) that the inventors and others of the present disclosure have examined will be described using FIG. 1 and FIG. 2. FIG. 1 is a block diagram illustrating one example of a configuration of the power conversion apparatus according to the comparative example. FIG. 2 is a voltage and current waveform diagram for describing an issue of the power conversion apparatus according to the comparative example.

A power conversion apparatus 2R according to the comparative example includes a switching element 11, a driver IC 20R and a control circuit 30R.

The switching element 11 is configured by coupling an IGBT 12_1 and an IGBT 12_2 in parallel with each other.

The driver IC 20R includes a drive control circuit 21R which drives the IGBTs 12_1 and 12_2 of the switching element 11, a current monitor circuit 22 which detects driving currents of the IGBTs 12_1 and 12_2, a cut-off circuit 23 which is coupled to the IGBTs 12_1 and 12_2 via a cut-off resistor Rc and an MCU_I/F 24 which interfaces with the control circuit 30R in one semiconductor chip. The drive control circuit 21R generates a drive signal used for driving gate electrodes for turning the IGBTs 12_1 and 12_2 on and off on the basis of a PWM signal from the control circuit 30R. Gate resistors Rg1 and Rg2 are arranged between the drive control circuit 21R and the IGBT 12_1 and between the drive control circuit 21R and the IGBT 12_2. A current detection resistor Re1 is coupled to a sense emitter terminal of the IGBT 12_1 and the current monitor circuit 22 and a current detection resistor Re2 is coupled to a sense emitter terminal of the IGBT 12_2 and the current monitor circuit 22. Incidentally, the current monitor circuit 22 is a circuit adapted to monitor in a manner that overcurrent does not flow into the IGBTs 12_1 and 12_2 and reduces currents flowing into the IGBTs 12_1 and 12_2 by lowering gate voltages by the cut-off circuit 23 and the cut-off resistor Rc in a case where a current of a predetermined magnitude is detected.

The control circuit 30R includes a CPU 31, a PWM circuit (RWM) 33, a memory unit (MEMORY) 32 and an I/O interface (I/O_IF) 34 which is an input/output unit which interfaces with an external device in one semiconductor chip and is configured by, for example, a microcomputer unit (MCU). The memory unit 32 is configured by an electrically rewritable nonvolatile memory such as a flash memory and so forth. In addition, a program (a motor control program) that the CPU 31 executes is stored in the memory unit 32.

The power conversion apparatus according to the comparative example has the following issues.

(a) Operations performed in a case where characteristics (for example, Vth) of the two IGBTs which are coupled in parallel with each other are different from each other will be described using FIG. 2.

In a case where a gate signal voltage ($V_G$) which is output from the drive control circuit 21R is applied to the IGBTs 12_1 and 12_2, when the Vth characteristics of the IGBTs 12_1 and 12_2 are different from each other, a gate terminal voltage ($V_{GE1}$) of the IGBT 12_1 and a gate terminal voltage ($V_{GE2}$) of the IGBT 12_2 exhibit different waveforms and a sense current ($I_{SE1}$) of the IGBT 12_1 and a sense current ($I_{SE2}$) of the IGBT 12_2 also exhibit different waveforms. Here, when Vth of the IGBT 12_1 is Vth1 and Vth of the IGBT 12_2 is Vth2, Vth2>Vth1 (Vth1≠Vth2). Incidentally, the sense current is a minute current having a correlation (a predetermined mirror ratio) with an emitter current. When Vth of the IGBT 12_1 is lower than Vth of the IGBT 12_2, a turn-on time (Tom) of the IGBT 12_1 becomes shorter than a turn-on time ($T_{ON2}$) of the IGBT 12_2. Incidentally, when the IGBTs are turned on, the gate terminal voltages $V_{GE1}$ and $V_{GE2}$ change in a slope reducing direction and the sense currents $I_{SE1}$ and $I_{SE2}$ begin to flow.

In a case where there is a deviation in threshold value for on/off (ON/OFF) operations between the IGBTs 12_1 and 12_2 in this way, such state mismatching that when one IGBT is turned on, the other IGBT is still in the off-state occurs. Thereby, an unbalance occurs in currents respectively flowing into the IGBTs 12_1 and 12_2 and there are dangers that an abnormal current may be generated due to an oscillation state and so forth caused by a current loop and the IGBTs may enter a failure mode.

(b) When the variation is corrected by using the gate resistors Rg1 and Rg2 as countermeasures to the above-described issue (a), a resistance value is increased and thereby responsiveness is lowered, a limit value of a motor rotation frequency is lowered and performance is not improved.

(c) When the manufacturer of the IGBTs performs sorting for rank separation for mutually matching the characteristics of the IGBTs 12_1 and 12_2 as the countermeasures to the above-described issue (a), it leads to an increase in cost on the manufacturer side consumed for coping with special sorting and so forth.

(d) Even when rank separation is performed on the IGBTs 12_1 and 12_2, necessity for performing post-system-implementation adjustment and confirmation work inevitably occurs due to presence of a variation in resistance between the resistors Rg1 and Rg2, a variation in driving between the drive control circuits and so forth, and a system board concerned is handled as a defective product and it leads to an increase in cost on the user side in a case where the variations exceed adjustable ranges.

PRACTICAL EXAMPLE

Next, a semiconductor device according to one practical example will be described.

The semiconductor device according to one practical example includes a plurality of drive control circuits which individually drive a plurality of semiconductor devices for power (for example, the IGBTs) which are coupled in parallel with one another, a voltage monitor circuit adapted to monitor a gate voltage of each IGBT and a current monitor circuit adapted to monitor a driving current into each IGBT. Each drive control circuit includes a waveform generation circuit which is able to optionally generate a gate signal according to the characteristic of the IGBT to be coupled.

Each drive control circuit includes a current drive circuit which is able to stepwise raise and lower the gate voltage in response to a command from a semiconductor device for control which controls the semiconductor device according to the practical example in order to examine the characteristic of the IGBT to be coupled.

The current drive circuit which is used in testing is formed by scaling down a current drive circuit which is used in a normal state in the waveform generation circuit and the driving current of the current drive circuit which is used in testing is made small at a fixed ratio relative to the current drive circuit which is used in the normal state.

The semiconductor device for control includes a CPU and a memory unit, stores monitor information from a voltage monitor circuit and a current monitor circuit into the memory unit together with time information and holds a characteristic inspection program used for examining state transition of the IGBTs in the memory unit.

The semiconductor device according to the practical example is controlled by the semiconductor device for control, performs characteristic inspection of the IGBTs which are coupled in system implementation and performs synchronization of driving timings of the IGBTs having different characteristics and correction of drive capabilities of the IGBTs.

The drive control circuit is caused to transition to a test mode and threshold voltages and so forth on the basis of which the IGBTs are turned on and off are inspected by a drive circuit and a detection circuit in a test waveform generation circuit.

The characteristic inspection program is used for the purpose of performing a test on each IGBT and storing a result of the test into the memory unit as characteristic data.

A characteristic correction program is used for the purpose of updating data in a base data memory of the waveform generation circuit on the basis of a result of characteristic inspection on each IGBT obtained by execution of the characteristic inspection program in order to eliminate a difference in characteristic between the parallel-coupled IGBTs. Characteristic correction (updating of the data in the base data memory) according to the characteristic correction program is individually set for each IGBT at turning-on and turning-off of each IGBT.

According to the practical example, at least any one of the following operational effects is obtained.

(1) It is possible to couple the plurality of IGBTs in parallel with one another and to increase the motor drive capabilities by raising the driving currents of the IGBTs.

(2) Since it is possible to synchronize the state transitions at turning-on and turning off with each other irrespective of parallel coupling of the IGBTs having different characteristics, it is possible to suppress generation of the abnormal currents caused by characteristic mismatching and the quality is improved.

(3) An overshoot or undershoot current generated when performing high-speed switching is suppressed by changing the drive capability of the gate signal and thereby it becomes possible to reduce switching noises and switching losses (leads to a reduction in power consumption).

(4) Improvement of a motor rotation frequency is promoted by performing driving by characteristic optimization.

(5) Work of correcting the gate resistance for each IGBT becomes unnecessary by performing the characteristic inspection of each IGBT using the semiconductor device for control and thus it is possible to reduce a time taken for the adjustment work. In addition, an inspection process and a product classified shipment process performed for rank separation and sorting of the characteristics of the IGBTs become unnecessary and it is possible to prevent an increase in cost of the IGBTs.

(6) Since the characteristic of each IGBT is acquired in the test mode, it is not necessary to prepare in advance the characteristic of each IGBT by experimentation and computer simulation.

(7) Since the characteristic of each IGBT is acquired by the system using the IGBT, it is possible to acquire the characteristics of the IGBTs including characteristics of the drive circuit, the gate resistor and so forth and therefore it is possible to increase the accuracy.

One example of the practical example will be described by using the following embodiment.

Embodiment

Figure 3:
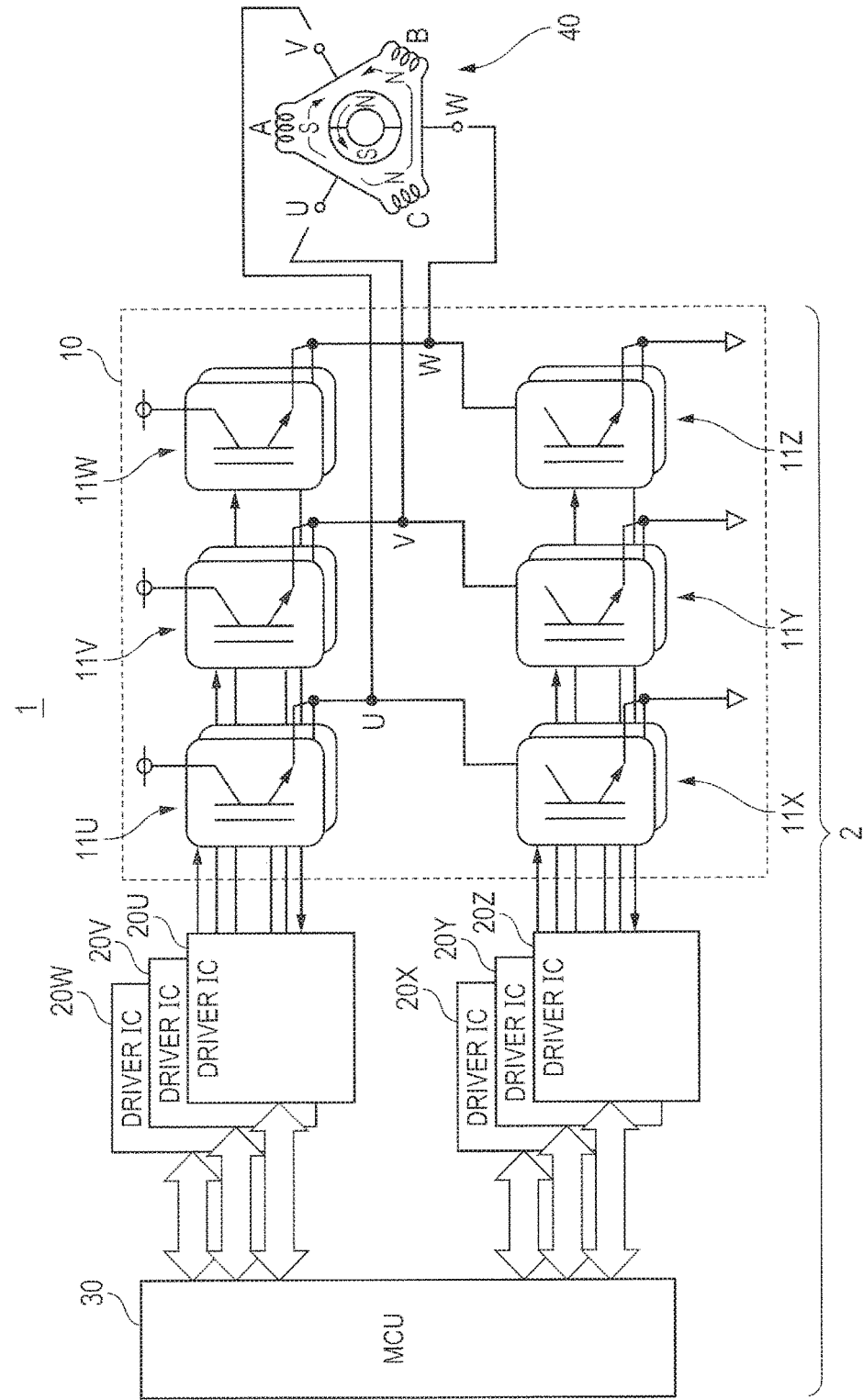
FIG. 3 is a block diagram illustrating one example of a configuration of an electric motor system according to one embodiment.

An electric motor system 1 according to one embodiment will be described using FIG. 3. FIG. 3 is a block diagram illustrating one example of a configuration of the electric motor system 1 according to the embodiment.

The electric motor system 1 according to the embodiment includes a three-phase motor 40, a power conversion apparatus 2 which controls the three-phase motor 40 and so forth. The power conversion apparatus 2 includes an inverter circuit 10, driver ICs 20U, 20V, 20W, 20X, 20Y, 20Z which are six semiconductor devices for driving, a control circuit (MCU) 30 which is a semiconductor device for control and so forth. Switching elements 11U, 11V, 11W, 11X, 11Y and 11Z which are arranged in the inverter circuit 10 are controlled to be turned on and off so as to make the currents flow into respective phases of the three-phase motor 40 when driving a vehicle and so forth and the speed of the vehicle and so forth is changed depending on a frequency of this switching operation. In addition, when braking the vehicle and so forth, the switching elements 11U, 11V, 11W, 11X, 11Y and 11Z are controlled to be turned on and off in synchronization with a voltage generated in each phase of the three-phase motor 40 and thereby a so-called commutation operation is performed and regeneration is performed by converting the voltage generated in each phase into a DC voltage.

In the three-phase motor 40, a rotor is configured by a permanent magnet, an armature is configured by a coil and armature windings of three phases (a U-phase, a V-phase and a W-phase) are arranged at intervals of about 120 degrees. The coils are coupled in a delta configuration and the currents typically flow into the three coils of the U-phase, the V-phase and the W-phase.

The inverter circuit 10 is configured by the switching element 11U for the upper-arm U-phase, the switching element 11V for the upper-arm V-phase, the switching element 11W for the upper-arm W-phase, the switching element 11X for the lower-arm U-phase, the switching element 11Y for the lower-arm V-phase and the switching element 11Z for the lower-arm W-phase. Each of the switching elements 11U, 11V, 11W, 11X, 11Y and 11Z is configured by coupling the IGBTs which are the semiconductor devices for power in parallel with each other. Each of the switching elements 11U, 11V, 11W, 11X, 11Y and 11Z includes reflux diodes (not illustrated) which are coupled in parallel between an emitter and a collector of each transistor of each of the IGBTs 12_1 and 12_2. The reflux diode is coupled to make the current flow in a direction opposite to that of the current which flows into each IGBT. The reflux diode may be formed in a semiconductor chip which is different from that of the IGBT or may be formed in the same chip as that of the IGBT.

The electric motor system 1 is used as a power source of the HEV, the EV and so forth. The power conversion apparatus is used as an on-vehicle electronic apparatus.

Figure 4:
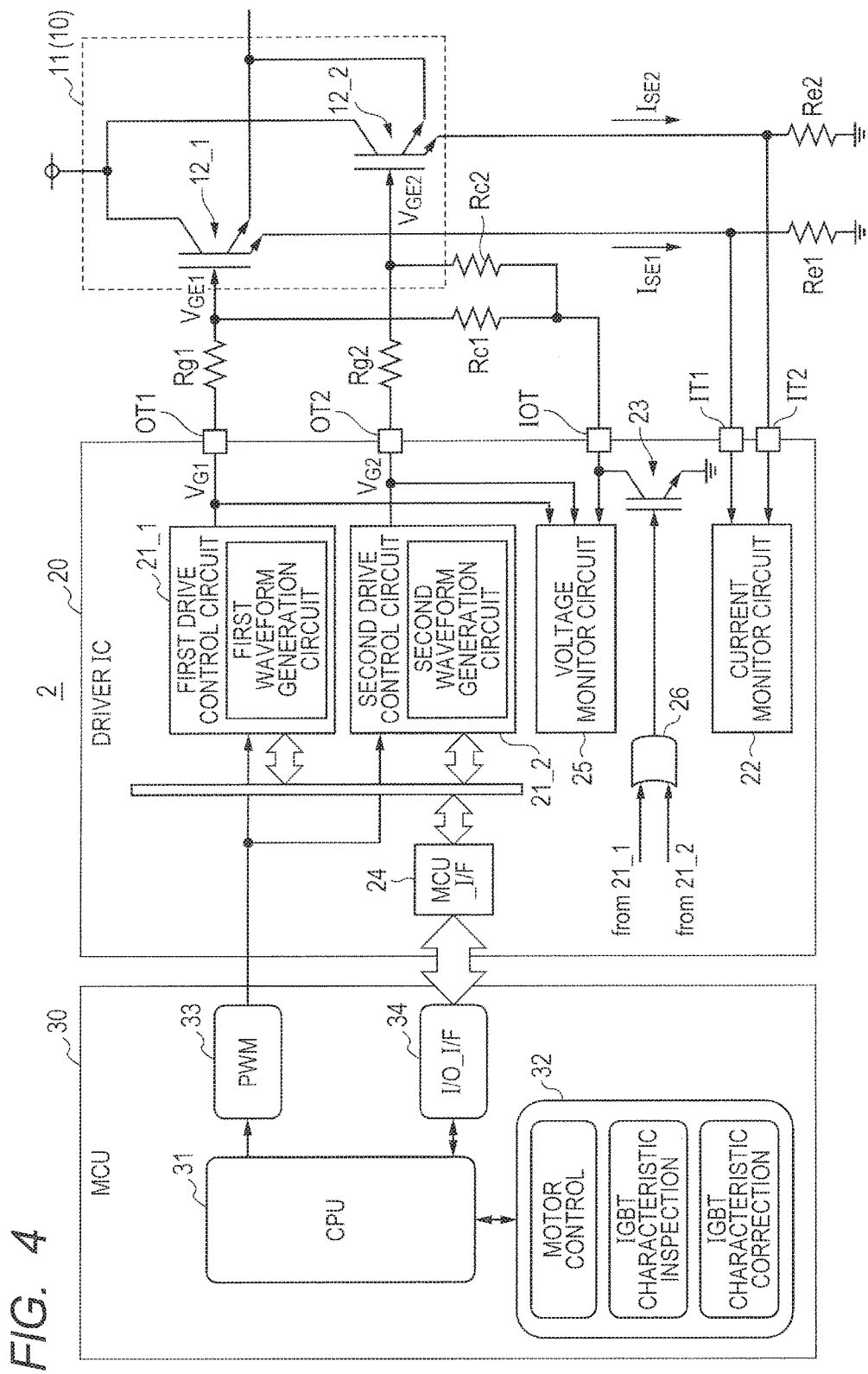
FIG. 4 is a block diagram illustrating one example of a configuration of one phase of a power conversion apparatus in FIG. 3.

Then, a configuration of the power conversion apparatus according to the embodiment will be described by using FIG. 4. FIG. 4 is a block diagram illustrating one example of a configuration of the power conversion apparatus 2 according to the embodiment. Although, in FIG. 4, description will be made by illustrating only one phase of the power conversion apparatus 2, the same is true of other phases. In the following, in a case where it is not necessary to distinguish the respective switching elements 11U, 11V, 11W, 11X, 11Y and 11Z from one another, the switching elements will be described as a switching element 11.

The power conversion apparatus 2 according to the embodiment includes the inverter circuit 10 having the switching element 11, a driver IC 20 and a control circuit 30.

The switching element 11 is configured by coupling the IGBT 12_1 in parallel with the IGBT 12_2.

The driver IC 20 includes a first drive control circuit 21_1 which drives the IGBT 12_1, a second drive control circuit 21_2 which drives the IGBT 12_2, and a current monitor circuit 22 which detects driving currents of the IGBTs 12_1 and 12_2. In addition, the driver IC 20 includes the cut-off circuit 23 which cuts off driving of gate terminals of the IGBTs 12_1 and 12_2, the MCU_I/F 24 which interfaces with the control circuit 30, a voltage monitor circuit 25 which detects gate voltages of the IGBTs 12_1 and 12_2, a logic circuit 26 which controls the cut-off circuit 23 and so forth. The above-described constitutional elements of the driver IC 20 are included in one semiconductor chip. Each of the first drive control circuit 21_1 and the second drive control circuit 21_2 generates the gate signal used for driving the gate terminal to turn on and off each of the IGBTs 12_1 and 12_2 on the basis of a PWM (Pulse Width Modulation) signal from the control circuit 30. The logic circuit 26 is a circuit which sets an output high when at least one of a signal from the first drive control circuit 21_1 and a signal from the second drive control circuit 21_2 is asserted and is, for example, an OR circuit. The cut-off circuit 23 is configured by a transistor whose collector is coupled to an input/output terminal IOT and an output from the logic circuit 26 is input into a gate terminal of the transistor.

The gate resistor Rg1 is arranged between a first output terminal OT1 and the gate terminal of the IGBT 12_1 and the gate resistor Rg2 is arranged between a second output terminal OT2 and the gate terminal of the IGBT 12_2. The resistors for current detection Re1 and Re2 are coupled respectively between an input terminal IT1 and a sense emitter terminal of the IGBT 21_1 and between an input terminal IT2 and a sense emitter terminal of the IGBT 12_2. Cut-off resistors Rc1 and Rc2 are coupled respectively between an input/output terminal IOT and the gate terminal of the IGBT 12_1 and between the input/output terminal IOT and the gate terminal of the IGBT 21_2. Incidentally, the current monitor circuit 22 is a circuit adapted to monitor in a manner that overcurrent does not flow into the IGBTs 12_1 and 12_2 and reduces the currents into the IGBTs 12_1 and 12_2 by lowering the gate voltages by the cut-off circuit 23 and the cut-off resistor Rc (Rc1, Rc2) in a case where a current of a predetermined magnitude is detected. In addition, the current monitor circuit 22 and the voltage monitor circuit 25 are used when acquiring characteristic information of the IGBTs in a test mode which will be described later.

The control circuit 30 includes the CPU 31, the PWM circuit (PWM) 33, the memory unit 32 and the I/O interface (I/O_IF) 34 which is the input/output unit which interfaces with the external device in one semiconductor chip and is configured by, for example, a microcomputer unit (MCU). It is preferable that the memory unit 32 be configured by an electrically rewritable nonvolatile memory such as the above-described flash memory and so forth. In addition, programs (a motor control program, an IGBT characteristic inspection program, an IGBT characteristic correction program and so forth) that the CPU 31 executes are stored in the memory unit 32.

Figure 5:
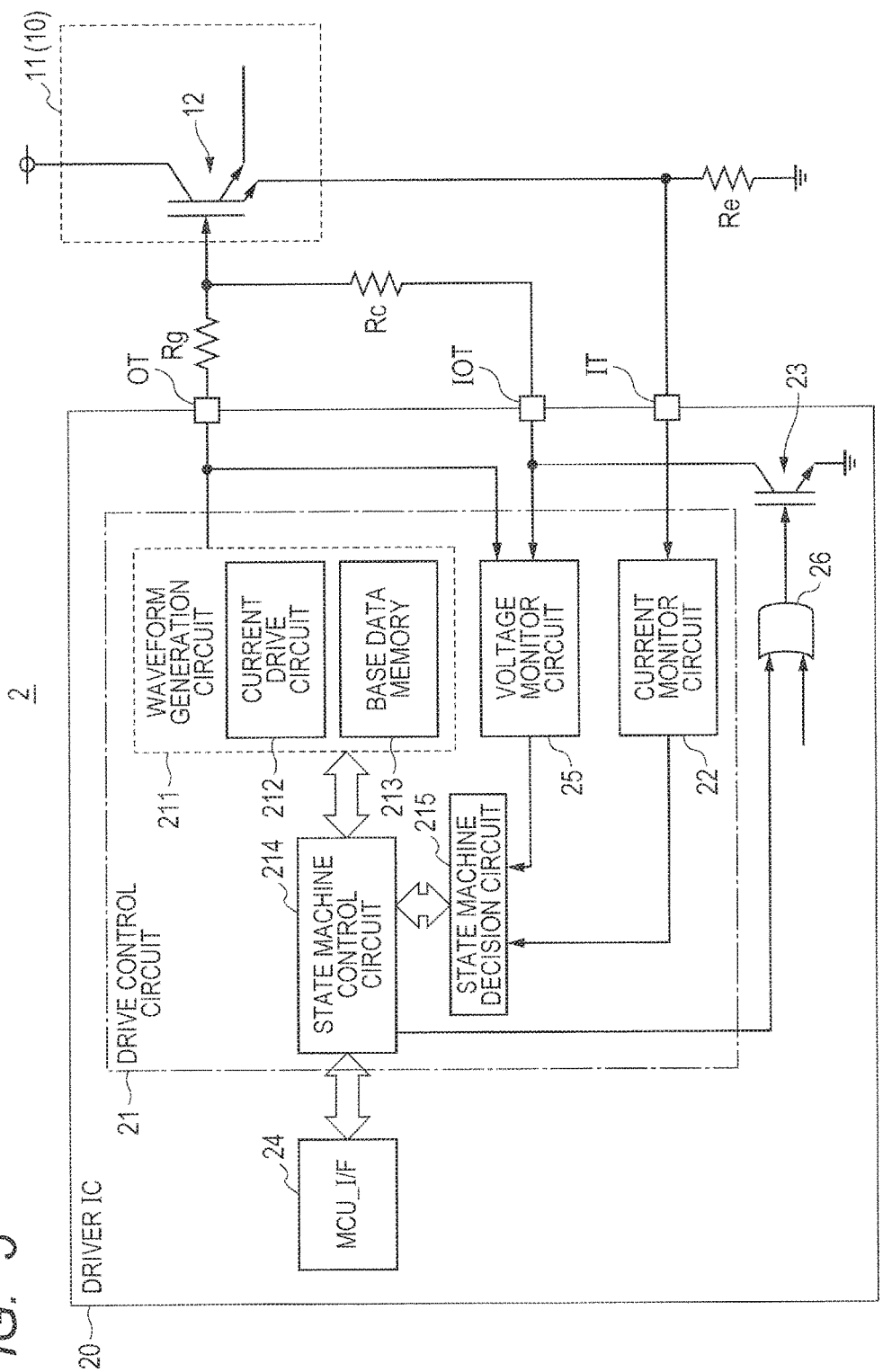
FIG. 5 is a block diagram illustrating one example of a configuration of one channel of a driver IC in FIG. 4.

Then, a configuration of the driver IC according to the embodiment will be described by using FIG. 5. FIG. 5 is a block diagram illustrating one example of the configuration of the driver IC according to the embodiment. Although, in FIG. 5, description will be made by illustrating control of only one channel (one IGBT) in the power conversion apparatus 2, the same is true of other channels. In the following, in a case where it is not necessary to distinguish the first drive control circuit 21_1 from the second drive control circuit 21_2, the first and second drive control circuits will be described as a drive control circuit 21. In addition, in constitutional elements included in the drive control circuit 21, for example, a first waveform generation circuit and a second waveform generation circuit will be described as a waveform generation circuit 211. Likewise, the output terminals OT1 and OT2, the input terminals IT1 and IT2, the IGBTs 12_1 and 12_2, the gate resistors Rg1 and Rg2, the cut-off resistors Rc1 and Rc2, and the current detection resistors Re1 and Re2 will be described as an output terminal OT, an input terminal IT, an IGBT 12, a gate resistor Rg, a cut-off resistor Rc and a current detection resistor Re respectively.

The drive control circuit 21 includes the waveform generation circuit 211, a state machine control circuit 214, a state machine decision circuit 215, the current monitor circuit 22, the voltage monitor circuit 25 and so forth. Incidentally, the current monitor circuit 22 in FIG. 5 is a circuit for one channel and is included in the current monitor circuit 22 in FIG. 4. The voltage monitor circuit 25 in FIG. 5 is a circuit for one channel and is included in the voltage monitor circuit 25 in FIG. 4. In FIG. 5, the current monitor circuit 22 and the voltage monitor circuit 25 are included in the drive control circuit 21. Although the same number of the current monitor circuits 22 as the number of the parallel-coupled IGBTs is necessary for detection of overcurrent of the IGBTs, the voltage monitor circuit 25 may be shared among the plurality of IGBTs in a case of using the voltage monitor circuit 25 only in the test mode which will be described later. The waveform generation circuit 211 includes a current drive circuit 212 and a base data memory 213. It is preferable that the base data memory 213 be configured by an electrically rewritable nonvolatile memory. Incidentally, the drive control circuit 21 may be configured by the MCU.

Figure 6:
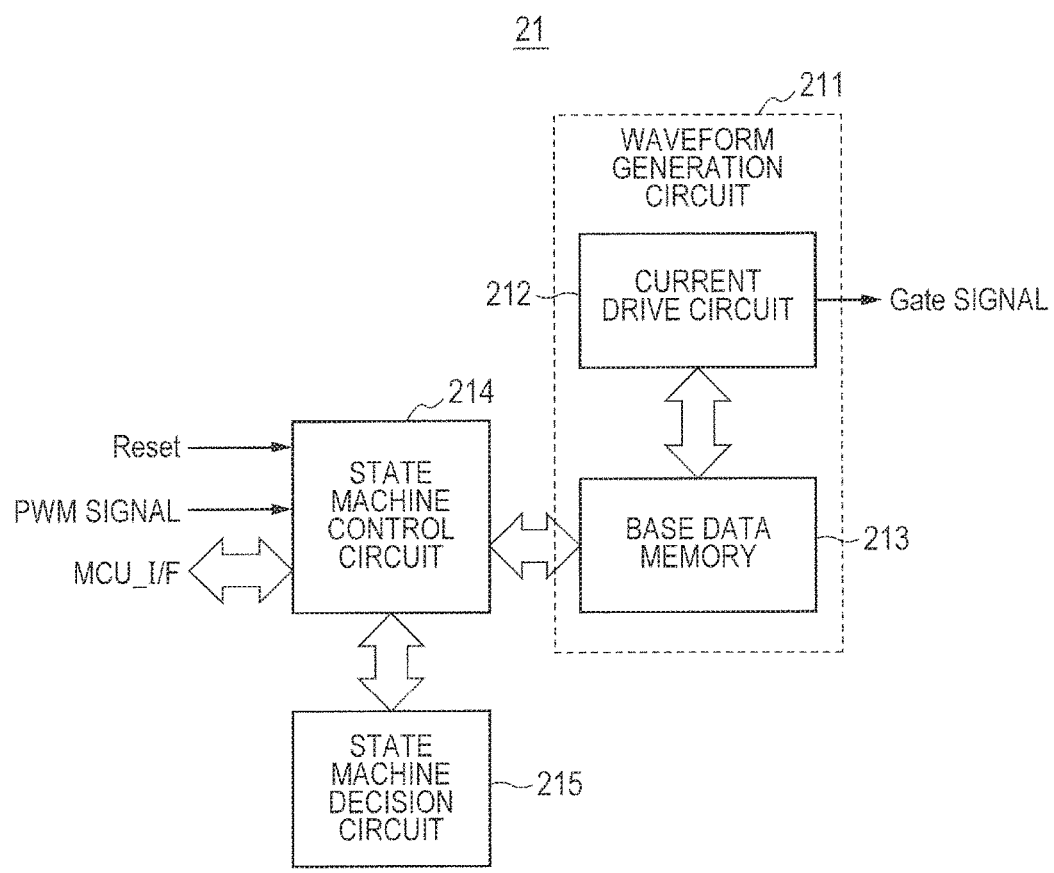
FIG. 6 is a block diagram illustrating one example of a configuration of a drive control circuit in FIG. 5.
Figure 7:
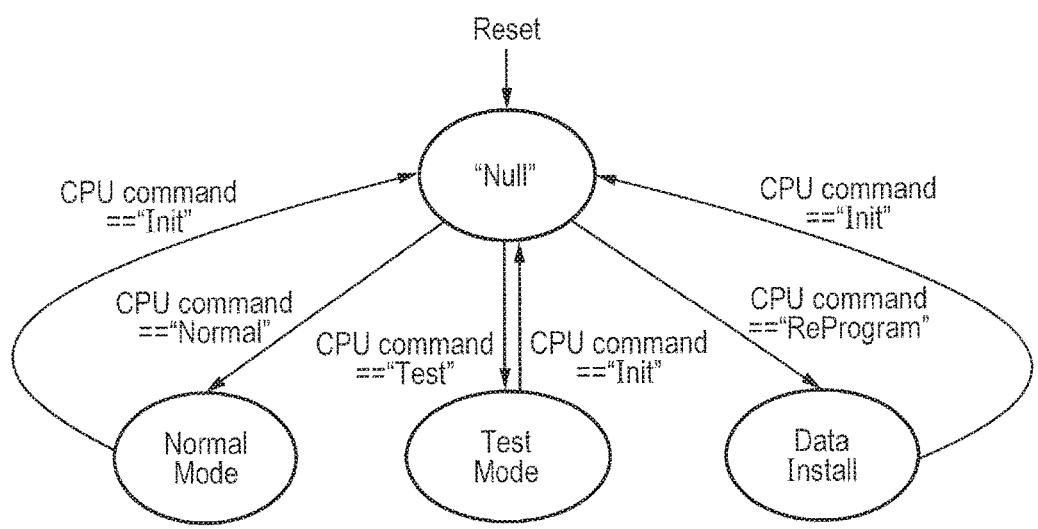
FIG. 7 is a state transition diagram of the drive control circuit in FIG. 5.

Next, state transition of the drive control circuit (the driver IC) 21 will be described by using FIG. 6 and FIG. 7. FIG. 6 is a block diagram illustrating one example of main part of the drive control circuit 21. FIG. 7 is a diagram illustrating one example of the state transition of the drive control circuit 21.

A reset signal (Reset) is asserted and thereby the drive control circuit 21 enters a "Null" state of waiting reception of a command from the CPU 31. In a case where the command from the CPU 31 is "ReProgram", the drive control circuit 21 enters a "Data Install" state of writing data into the base data memory 213 in response to the command from the CPU 31. In a case where the command from the CPU 31 is "Test", the drive control circuit 21 enters a "Test Mode" state of acquiring characteristic data of the IGBTs. In a case where the command from the CPU 31 is "Normal", the drive control circuit 21 enters a "Normal Mode" state of performing a normal operation. In a case where the command from the CPU is "Init" in each of the "Data Install" sate, the "Test Mode" state and the "Normal Mode" state, the drive control circuit 21 enters the "Null" state. In the "Null" state, an output from the drive control circuit 21 to the output terminal OT is at a low level for turning the IGBT off.

Figure 8:
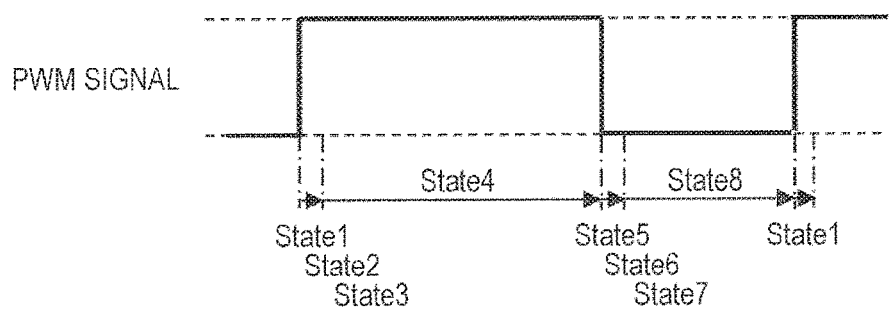
FIG. 8 is a waveform diagram illustrating one example of a PWM signal and states in a normal mode in FIG. 7.
Figure 11:
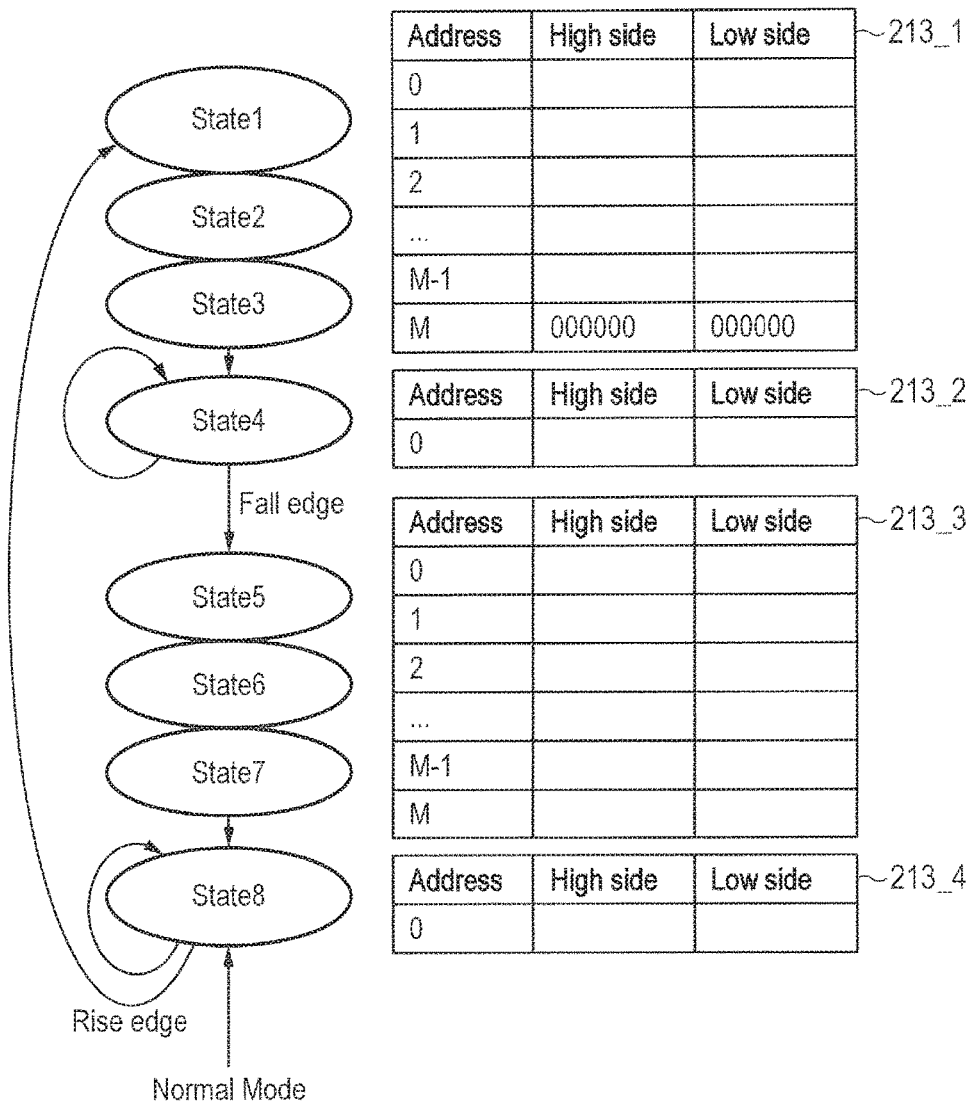
FIG. 11 is a diagram illustrating one example of a relation between state transition in the normal mode in FIG. 7 and base data memories

Then, state transition in the normal mode ("Normal Mode") will be described by using FIG. 8 to FIG. 11. FIG. 8 is a waveform diagram illustrating one example of the PWM signal and states in the normal mode in FIG. 7. FIG. 9 is a waveform diagram illustrating one example of the states of the IGBTs, corresponding to the PWM waveform diagram in FIG. 8. FIG. 10 is a diagram illustrating one example of states of the IGBTs in FIG. 9. FIG. 11 is a diagram illustrating one example of a relation between the state transition in the normal mode in FIG. 7 and the base data memory 213 (213_1 to 213_4).

Transitional periods of rising of the PWM signal are a first state (State1), a second state (State2) and a third state (State3) and a period that the PWM signal is stabilized at a high level is a fourth state (State4). Transitional periods of falling of the PWM signal area fifth state (State5), a sixth state (State6) and a seventh state (State7) and a period that the PWM signal is stabilized at a low level is an eighth state (State8).

The first state (State1) is a state of making the current flow into the gate terminal of the IGBT 12 and charging a gate circuit capacity (a gate-to-collector parasitic capacity and a gate-to-emitter parasitic capacity) and is the state where a voltage which is smaller than a threshold value is applied to the gate terminal of the IGBT 12. Although in this state, a gate terminal voltage ($V_{GE}$) of the IGBT 12 rises together with rising of a gate signal voltage ($V_G$) at the output terminal OT, the IGBT 12 is not turned on and no sense current ($I_{SE}$) flows. Incidentally, the sense current ($I_{SE}$) in FIG. 9 is expressed in terms of a voltage ($V_{SE}$) at which the sense current is detected.

The second state (State2) is a state where charging of the gate circuit capacity is completed and the IGBT 12 transitions to an on-state and the state where a voltage which is larger than the threshold value is applied to the gate terminal of the IGBT 12. In this state, although a rising rate of the voltage $V_{GE}$ is smaller than a rising rate of the voltage $V_G$, the current $I_{SE}$ rises together with rising of the voltage $V_G$.

The third state (State3) is a state directly before a saturation state. In this state, a rising rate of the current $I_{SE}$ is smaller than the rising rate of the voltage $V_G$.

The fourth state (State4) is a state where the on-state is saturated.

The fifth state (State5) is a state of discharging the gate circuit capacity by drawing the current out of the gate terminal of the IGBT 12 and is the state where the voltage which is larger than the threshold value is applied to the gate terminal of the IGBT 12. In this state, a lowering rate of the voltage $V_{GE}$ is smaller than a lowering rate of the voltage $V_G$ and the current ISE shows almost no reduction.

The sixth state (State6) is a state where discharging of the gate circuit capacity is completed and the IGBT 12 transitions to an off-state and is the state where the voltage which is smaller than the threshold voltage is applied to the gate terminal of the IGBT 12. In this state, although the lowering rate of the voltage $V_{GE}$ is smaller than the lowering rate of the voltage $V_G$, the current $I_{SE}$ lowers together with lowering of the voltage $V_G$.

The seventh state (State7) is a state directly before the off-state. In this state, the lowering rate of the voltage $V_{GE}$ is larger than the lowering rate of the voltage $V_G$ and no current $I_{SE}$ flows.

The eighth state (State8) is a state where the off-state is saturated.

The state machine control circuit 214 is put on standby in the eighth state (State8) when shifting to the normal mode ("Normal Mode"). The state machine control circuit 214 detects a rising edge (Rise edge) of the PWM signal and then enters the first state (State1), transitions to the second state (State2) after a first predetermined time elapses, transitions to the third state (State3) after a second predetermined time elapses and transitions to the fourth state (State4) after a third predetermined time elapses. The state machine control circuit 214 maintains the fourth state (State4) until a falling edge (Fall edge) of the PWM signal is detected, detects the falling edge of the PWM signal, then enters the fifth state (State5), transitions to the sixth state (State6) after a fifth predetermined time elapses, transitions to the seventh state (State7) after a sixth predetermined time elapses and transitions to the eighth state (State8) after a seventh predetermined time elapses.

The first state is maintained for the first predetermined time and addresses of a first base data memory 213_1 correspond to 0 to L-1. Information corresponding to the drive capability of the current drive circuit 212 in the first state is stored in the addresses 0 to L-1. The second state is maintained for the second predetermined time and the addresses of the first base data memory 213_1 correspond to L to M-1. Information corresponding to the drive capability of the current drive circuit 212 in the second state is stored in the addresses L to M-1. The third state is maintained for the third predetermined time and the addresses of the first base data memory 213_1 correspond to M to N-1. Information corresponding to the drive capability of the current drive circuit 212 in the third state is stored in the addresses M to N-1. Driving current information is read out of the first base data memory 213_1 a plurality of times ranging from the first state to the third state in which the gate signal voltage rises and is supplied to the current drive circuit 212.

The fourth state is maintained until a falling edge of the PWM signal is detected and the address of a second base data memory 213_2 corresponds to 0. Information corresponding to the drive capability of the current drive circuit 212 in the fourth state is stored in the address 0.

The fifth state is maintained for the fourth predetermined time and the addresses of a third base data memory 213_3 correspond to 0 to I-1. Information corresponding to the drive capability of the current drive circuit 212 in the fifth state is stored in the addresses 0 to I-1. The sixth state is maintained for the fifth predetermined time and the addresses of the third base data memory 213_3 correspond to I to J-1. Information corresponding to the drive capability of the current drive circuit 212 in the sixth state is stored in the addresses I to J-1. The seventh state is maintained for the sixth predetermined time and the addresses of the third base data memory 213_3 correspond to J to K-1. Information corresponding to the drive capability of the current drive circuit 212 in the seventh state is stored in the addresses J to K-1. Driving current information is read out of the third base data memory 213_3 a plurality of times ranging from the fifth state to the seventh state in which the gate signal voltage falls and is supplied to the current drive circuit 212.

The eighth state is maintained until the rising edge of the PWM signal is detected and the address of a fourth base data memory 213_4 corresponds to 0. Information corresponding to the drive capability of the current drive circuit 212 in the eighth state is stored in the address 0.

Values of the first predetermined time, the second predetermined time, the third predetermined time, the fourth predetermined time, the fifth predetermined time, the first base data memory 213_1, the second base data memory 213_2, the third base data memory 213_3 and the fourth base data memory 213_4 are set on the basis of a result of characteristic detection in the test mode which will be described later.

Figure 12:
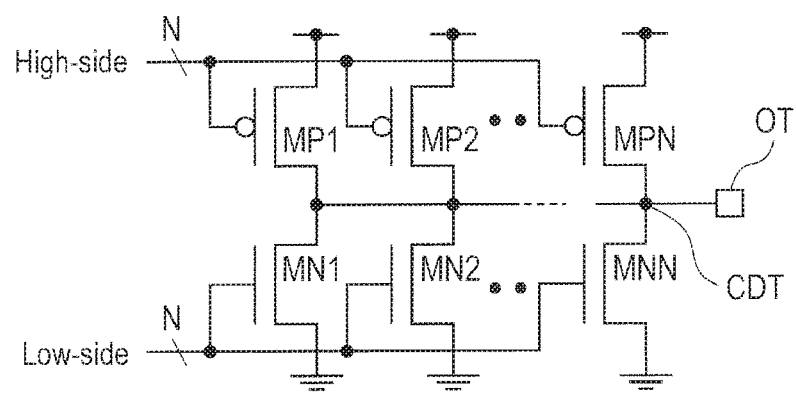
FIG. 12 is a circuit diagram illustrating one example of a configuration of a current drive circuit in FIG. 6.

The current drive circuit 212 will be described by using FIG. 12. FIG. 12 is a circuit diagram illustrating one example of a configuration of the current drive circuit 212 in FIG. 6.

The current drive circuit 212 includes N P-channel type MOS transistors (PMOS transistors) MP1 to MPN which are coupled in parallel between a high reference potential source and a terminal CDT and N N-channel type MOS transistors (NMOS transistors) MN1 to MNN which are coupled in parallel between a low reference potential source and the terminal CDT. In addition, the current drive circuit 212 includes N wiring lines which are coupled to respective gates of the PMOS transistors MP1 to MPN and N wiring lines which are coupled to respective gates of the NMOS transistors MN1 to MNN. The terminal CDT is coupled to the output terminal OT. The PMOS transistors MP1 to MPN rise the gate signal voltage ($V_G$) and the NMOS transistors MN1 to MNN fall the gate signal voltage ($V_G$). It is possible to adjust the drive capability of the current drive circuit 212 by adjusting the number of the PMOS transistors MP1 to MPN or the NMOS transistors MN1 to MNN which are driven side by side.

Information as to which PMOS transistor is to be driven in the PMOS transistors MP1 to MPN or which NMOS transistor is to be driven in the NMOS transistors MN1 to MNN is stored in the base data memory 213. Information on the PMOS transistors MP1 to MPN is stored on the "High side" and information on the NMOS transistors MN1 to MNN is stored in the "Low side" of the base data memory 213.

Each of the PMOS transistors MP1 to MPN and each of the NMOS transistors MN1 to MNN are laid out in scaled-down state in a manner that a current ratio of the current in the test mode to the current in the normal mode has a specific value. For example, in a case where the driving current for the PMOS transistor MP1 and the NMOS transistor MN1 is 1 ($=2^0$), when setting in a manner that the driving current for the PMOS transistor MP2 and the NMOS transistor NM2 reaches 2 ($=2^1$), . . . , the driving current for the PMOS transistor MPN and the NMOS transistor NMN reaches $2^{N-1}$, it becomes possible to drive the current drive circuit 212 with $2^N$ driving currents. Thus, it becomes possible to change the drive capability by changing the driving current information to be stored into the base data memory 213.

Figure 13:
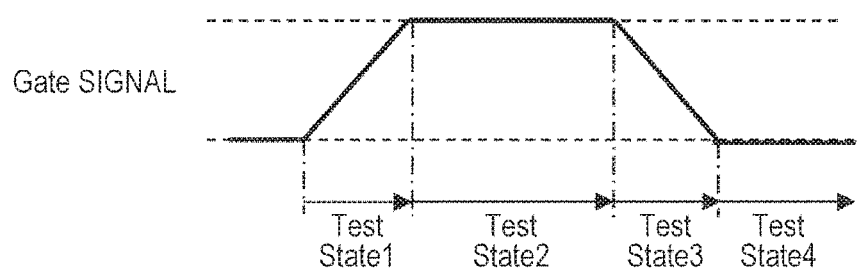
FIG. 13 is a waveform diagram illustrating one example of a gate signal and the states in a test mode in FIG. 7.
Figure 14:
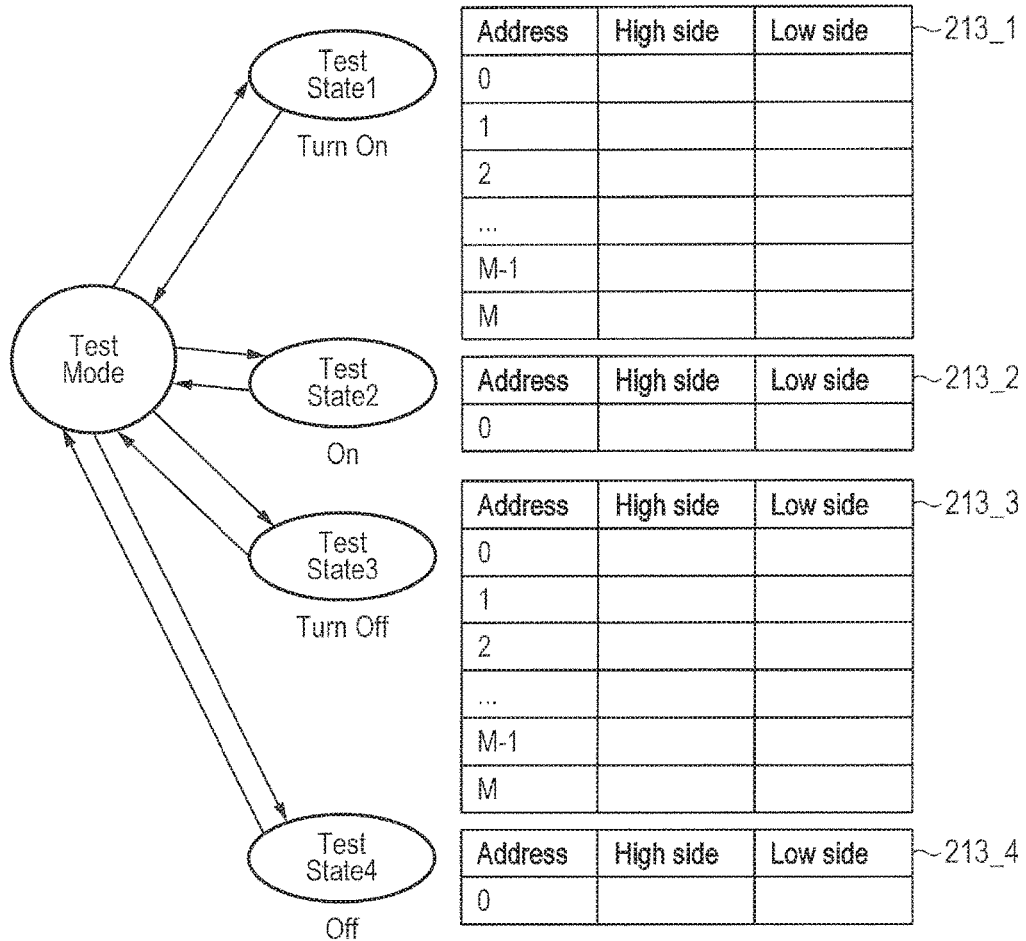
FIG. 14 is a diagram illustrating one example of a relation between the state transition in the test mode in FIG. and the base data memories.

Then, the state transition in the test mode ("Test Mode") will be described by using FIG. 13 and FIG. 14. FIG. 13 is a waveform diagram illustrating one example of the gate signal and the states in the test mode in FIG. 7. FIG. 14 is a diagram illustrating one example of a relation between the state transition in the test mode in FIG. 7 and the base data memories 213_1 to 213_4.

A state where the gate signal rises is a first test state (Test State1), a state where the gate signal reaches a high-level is a second test state (Test State2), a state where the gate signal falls is a third test state (Test State3) and a state where the gate signal reaches a low level is a fourth state (Test State4).

The state machine control circuit 214 enters the test mode ("Test Mode"), then transitions to the first test state (Test State1) after a predetermined time elapses, and returns to the test mode ("Test Mode") after a first test predetermined time elapses. Then, the state machine control circuit 214 transitions to the second test state (Test State2) after a predetermined time elapses and returns to the test mode ("Test Mode") after a second test predetermined time elapses. Then, the state machine control circuit 214 transitions to the third test state (Test State3) after a predetermined time elapses and returns to the test mode ("Test Mode") after a third test predetermined time elapses. Then, the state machine control circuit 214 transitions to the fourth test state (Test State4) after a predetermined time elapses and returns to the test mode ("Test Mode") after a fourth test predetermined time elapses.

The first test state is maintained for the first test predetermined time and the addresses of the first base data memory 213_1 correspond to 0 to M. Information corresponding to the drive capability of the current drive circuit 212 in the first test state is stored in the addresses 0 to M. The second test state is maintained for the second test predetermined time and the address of the second base memory 213_2 corresponds to 0. Information corresponding to the drive capability of the current drive circuit 212 in the second test state is stored in the address 0. The third test state is maintained for the third test predetermined time and the addresses of the third base data memory 213_3 correspond to 0 to M. Information corresponding to the drive capability of the current drive circuit 212 in the third test state is stored in the addresses 0 to M.

The drive capability of the current drive circuit 212 in the test mode ("Test Mode") is set to a value which is sufficiently smaller than the value of the drive capability of the current drive circuit 212 in the normal mode ("Normal Mode") for avoiding steep rising of the gate signal waveform (the gate signal voltage ($V_G$)). For example, the current drive circuit 212 which is in the test mode ("Test Mode") drives one PMOS transistor, that is, the PMOS transistor MP1 when the gate voltage ($V_G$) rises and drives one NMOS transistor, that is, the NMOS transistor MN1 when the gate voltage ($V_G$) falls. In addition, the driving current ratio of the current in the test mode ("Test Mode") to the current in the normal mode ("Normal Mode") has the specific value by laying out the respective transistors of the current drive circuit 212 in a scaled-down state as described above. Thereby, it is possible to accurately acquire the characteristic of the IGBT 12 at rising and falling of the gate signal.

Figure 15:
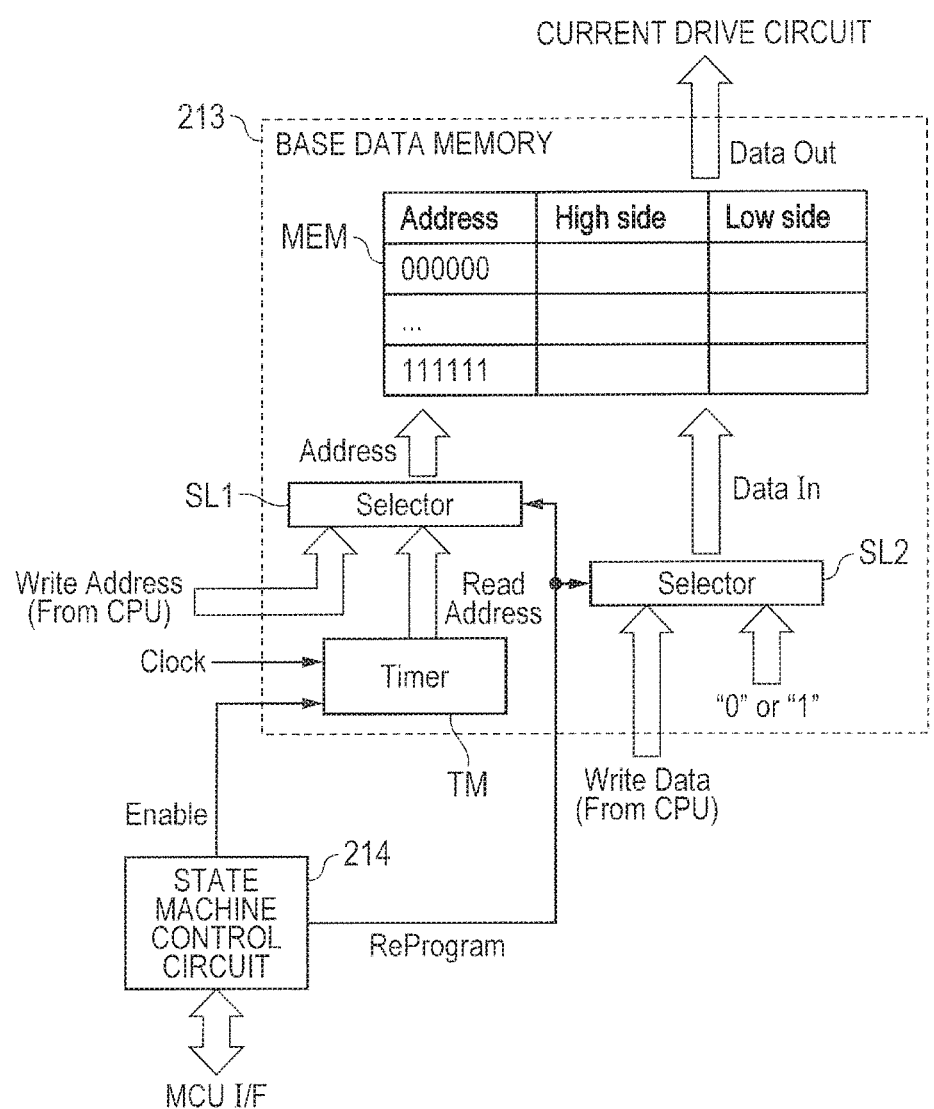
FIG. 15 is a block diagram illustrating one example of a configuration of the base data memory in FIG. 6.

Then, the base data memory 213 will be described by using FIG. 15. FIG. 15 is a block diagram illustrating one example of a configuration of the base data memory 213. The base data memory 213 includes the first base data memory 213_1, the second base data memory 213_2, the third base data memory 213_3 and the fourth base data memory 213_4 and each of the above-described base data memories 213_1 to 213_4 has the following configuration.

The base data memory 213 includes a memory unit MEM which stores information corresponding to the drive capability of the current drive circuit 212 and a timer (Timer) TM which generates a read address for the memory unit MEM. In addition, the base data memory 213 includes a first selector (Selector) SL1 which switches between a write address (Write Address) and the read address (Read Address) and a selector SL2 which switches between write data (Write Data) and a fixed value ("0" or "1") for floating prevention. In the "Data Install" state, the state machine control circuit 214 asserts (activates) a rewrite signal (Re-Program), the selector SL1 selects the write address (Write Address) and the selector SL2 selects the write data (Write Data). Thereby, it becomes possible to rewrite data in the base data memory 213 using the address and data from the CPU 31. In the "Normal Mode" state or the "Test Mode" state, the state machine control circuit 214 negates (deactivates) the rewrite signal, the selector SL1 selects the read address (Read Address) and the selector SL2 selects the fixed value. Thereby, it becomes possible to read the information corresponding to the drive capability out of the base data memory 213 using the address from the timer TM. When an enable (Enable) signal is asserted, the timer TM counts the clock (Clock) signal and the read address is incremented one by one from 0. Incidentally, setting may be made to read the information corresponding to the drive capability of the current drive circuit 212 out of the base data memory 213 using the address from the CPU 31 in the "Data Install" state.

The enable (Enable) signal of the timer TM of the first base data memory 213_1 is asserted when the first state (State1) is started and is negated when the third state (State3) is terminated. The enable (Enable) signal of the timer TM of the second base data memory 213_2 is asserted when the fourth state (State4) is started and is negated when the fifth state (State5) is started. The enable (Enable) signal of the timer TM of the third base data memory 213_3 is asserted when the fifth state (State5) is started and is negated when the seventh state (State7) is terminated. The enable (Enable) signal of the timer TM of the fourth base data memory 213_4 is asserted when the eighth state (State8) is started and is negated when the first state (State1) is started.

Figure 16:
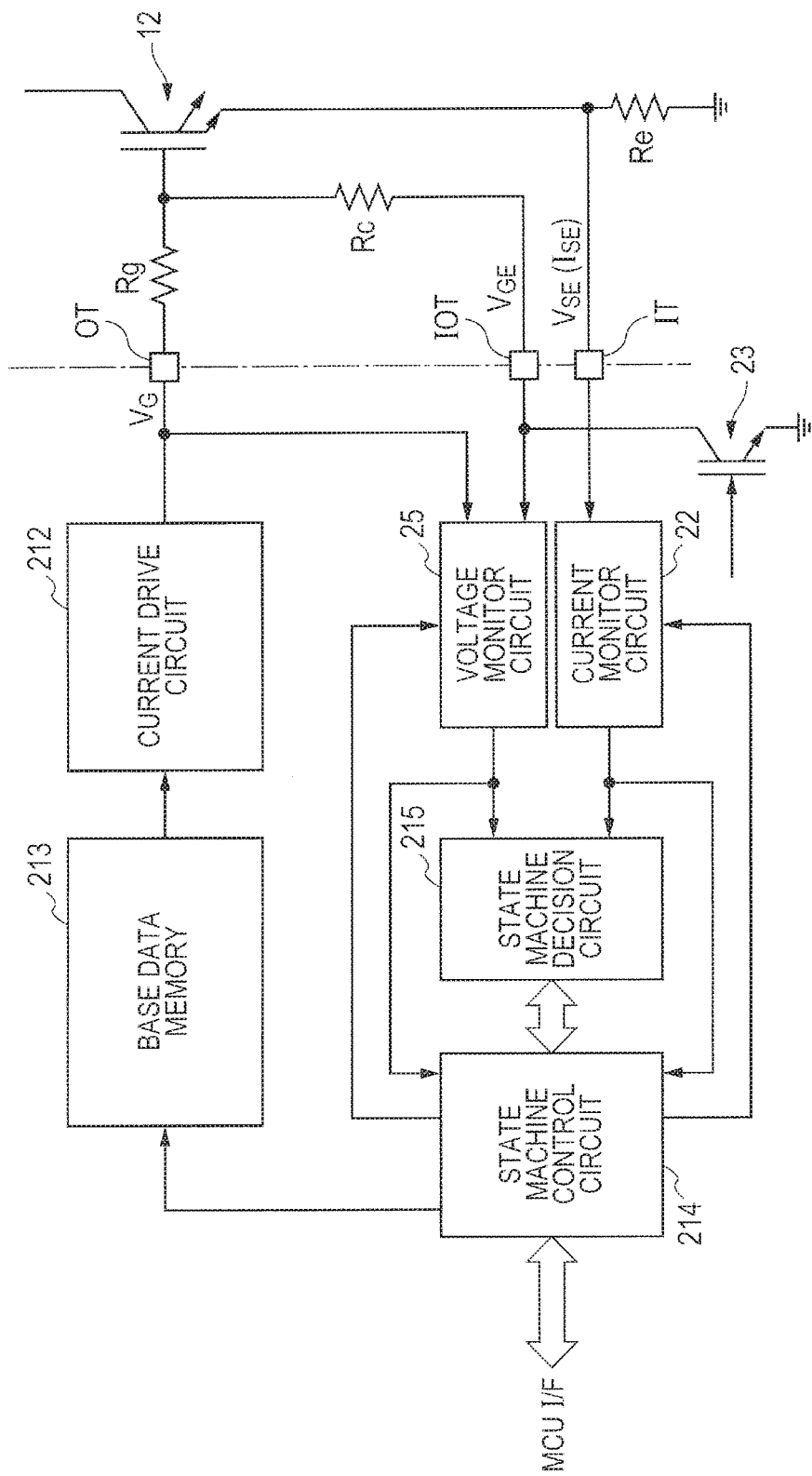
FIG. 16 is a block diagram illustrating one example of a circuit part in charge of characteristic inspection of the IGBT.
Figure 17:
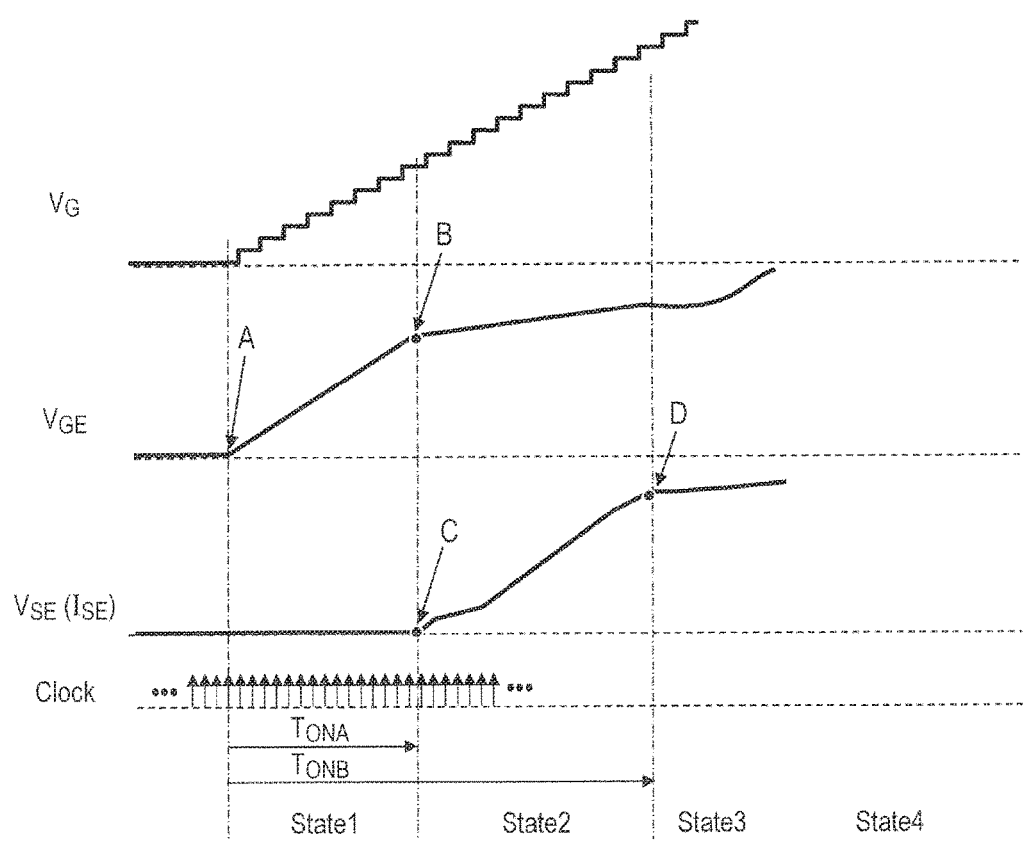
FIG. 17 is a timing chart illustrating one example of characteristic detection timings and the states of the IGBT at rising of a gate voltage.
Figure 18:
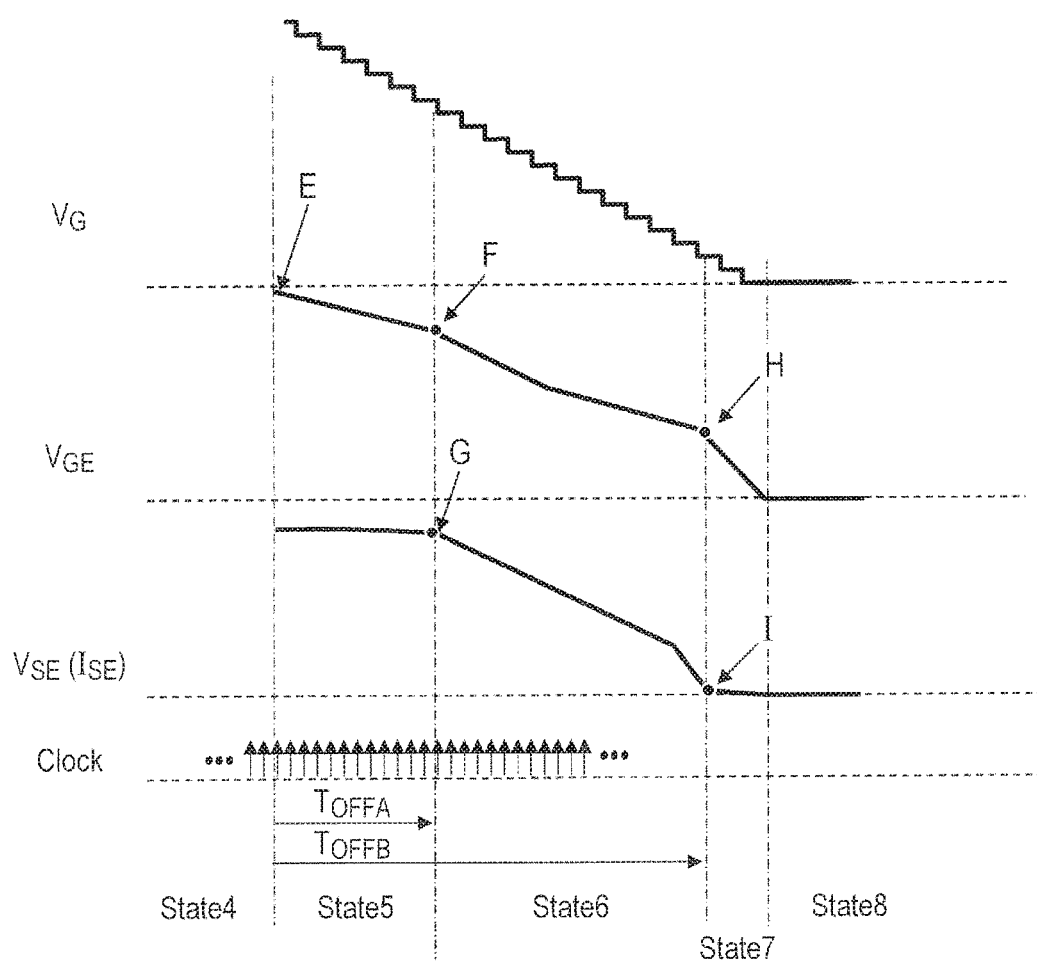
FIG. 18 is a timing chart illustrating one example of characteristic detection timings and the states of the IGBT at falling of the gate voltage.

Then, characteristic inspection of the IGBT 12 in the test mode ("Test Mode") will be described by using FIG. 16 to FIG. 24. FIG. 16 is a diagram illustrating one example of a circuit part in charge of characteristic inspection of the IGBT. FIG. 17 is a timing chart illustrating one example of characteristic detection timings and the states of the IGBT 12 at rising of the gate signal voltage. FIG. 18 is a timing chart illustrating one example of characteristic detection timings and the states of the IGBT 12 at falling of the gate signal voltage.

Main circuits included in a circuit (a characteristic inspection circuit) in charge of characteristic inspection of the IGBT 12 are the state machine control circuit 214, the base data memory 213, the current drive circuit 212, the voltage monitor circuit 25, the current monitor circuit 22 and the state machine control circuit 215. Although the current monitor circuit 22 is used for detection of overcurrent in the normal mode, a current detection voltage is low in the test mode and therefore it is preferable to amplify the voltage by a DC amplifier. It is possible to acquire the characteristic of the IGBT 12 by the characteristic inspection circuit.

The IGBT 12 exhibits characteristics as follows.

As illustrated in FIG. 17, the gate signal voltage ($V_G$) at the output terminal OT is driven by the current drive circuit 212 which is small in drive capability in synchronization with the clock signal (Clock) and therefore rises stepwise.

When the gate signal voltage ($V_G$) begins rising, charging of the gate circuit capacity of the IGBT 12 is started and a value of dV/dt of the gate terminal voltage ($V_{GE}$) which is input into the voltage monitor circuit 25 is increased in a positive direction (the timing A). The timing A in FIG. 17 corresponds to the timing A in the normal mode in FIG. 9.

When charging of the gate circuit capacity is completed and the IGBT 12 shifts to the on-state, the value of dV/dt of the voltage $V_{GE}$ is decreased (the timing B). The timing B in FIG. 17 corresponds to the timing B in the normal mode in FIG. 9.

When the voltage $V_{GE}$ exceeds a threshold voltage, the current begins flowing into the IGBT 12 and $I_{SE}$ (the sense current)>0 is established. Incidentally, the current detection voltage ($V_{SE}$) obtained by converting the current $I_{SE}$ into a voltage is input into the current monitor circuit 22 and $V_{SE}$>0 is established (the timing C). The timing C in FIG. 17 corresponds to the timing C in the normal mode in FIG. 9.

The current becomes almost constant with the aid of the stable on-state of the IGBT 12 and a value of dI/dt of the current $I_{SE}$ is decreased. Therefore, the value of dV/dt of the voltage $V_{SE}$ is decreased (the timing D). The timing D in FIG. 17 corresponds to the timing D in the normal mode in FIG. 9.

As illustrated in FIG. 18, the gate signal voltage ($V_G$) at the output terminal OT is used for the purpose of driving the current drive circuit 212 which is small in drive capability in synchronization with the clock signal (Clock) and therefore falls stepwise.

When the gate signal voltage (VG) begins falling, discharging of the gate circuit capacity of the IGBT 12 is started (the timing E). The timing E in FIG. 18 corresponds to the timing E in the normal mode in FIG. 9.

When the voltage $V_{GE}$ becomes lower than the threshold voltage, the off-state of the IGBT 12 is started (the timing F). The timing F in FIG. 18 corresponds to the timing F in the normal mode in FIG. 9.

When the voltage $V_{GE}$ becomes lower than the threshold voltage, the current of the IGBT 12 begins abruptly lowering and dI/dt of $I_{SE}$<0 is established. Therefore, dV/dt of $V_{GE}$<0 is established (the timing G). The timing G in FIG. 18 corresponds to the timing G in the normal mode in FIG. 9.

When discharging of the gate circuit capacity is completed and the IGBT 12 enters the stable off-state, the value of dV/dt of the voltage VGE is increased in a negative direction (the timing H). The timing H in FIG. 18 corresponds to the timing H in the normal mode in FIG. 9.

The current value of IsE is almost reduced to zero and the IGBT 12 enters the stable off-state (the timing I). The timing I in FIG. 18 corresponds to the timing I in the normal mode in FIG. 18.

The characteristic inspection circuit is able to detect a timing of shifting from the first state (State1) to the second state (State2) by detecting the timing C. In addition, the characteristic inspection circuit is able to detect a timing of shifting from the second state (State2) to the third state (State3) by detecting the timing D. In addition, the characteristic inspection circuit is able to detect a timing of shifting from the fifth state (State5) to the sixth state (State6) by detecting the timing D. In addition, the characteristic inspection circuit is able to detect a timing of shifting from the sixth state (State6) to the seventh state (State7) by detecting the timing H.

Incidentally, a timing of shifting from the third state (State3) to the fourth state (State4) is a timing of shifting from a first test state (Test State1) to a second test state (Test State2). A timing of shifting from the fourth state (State4) to the fifth state (State5) is a timing of shifting from the second test state (Test State2) to the third test state (Test State3). In addition, a timing of shifting from the seventh state (State7) to the eighth state (State8) is a timing of shifting from the third test state (Test State3) to the fourth test state (Test State4). A timing of shifting from the eighth state (State8) to the first state (State1) is a timing of shifting from the fourth test state (Test State4) to the first test state (Test State1).

Figure 19:
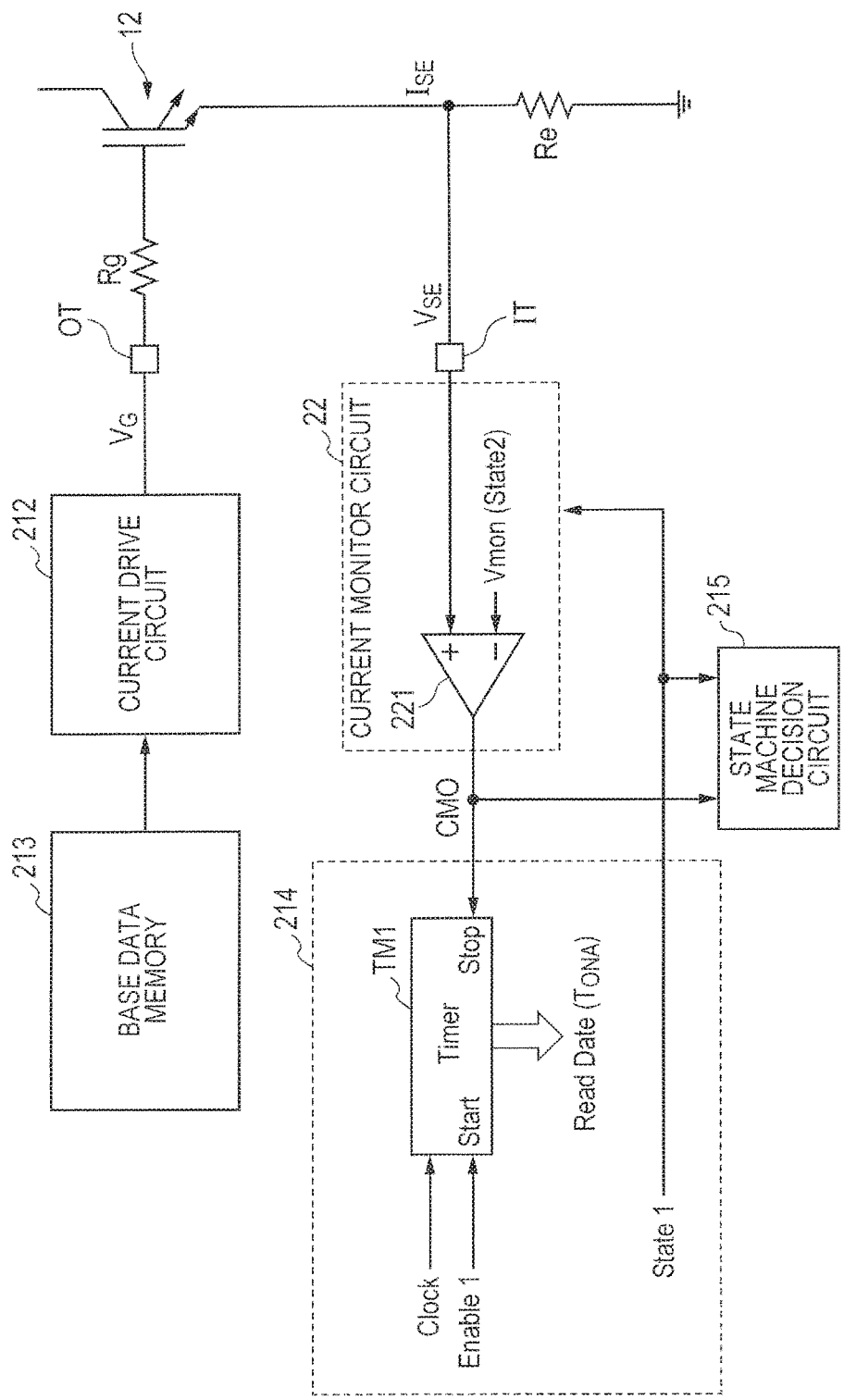
FIG. 19 is a block diagram illustrating one example of a configuration of a circuit which detects a timing C.
Figure 20:
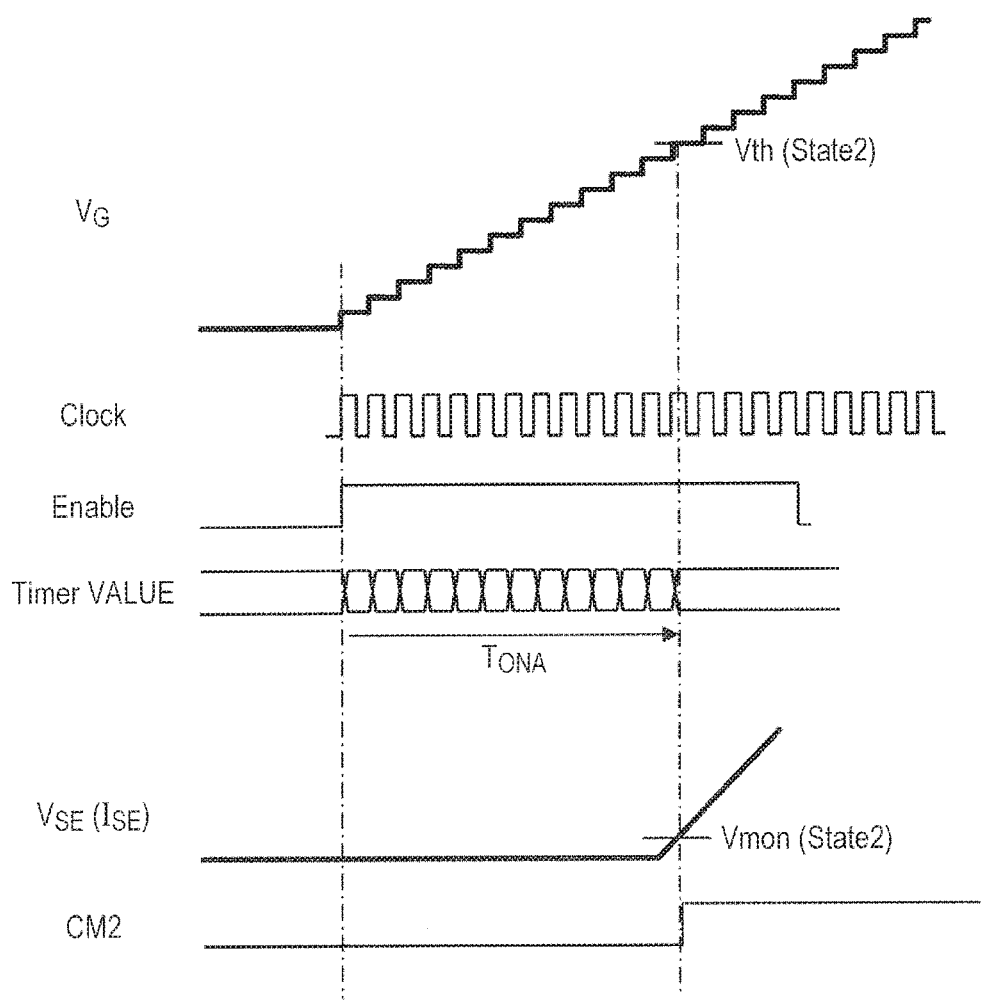
FIG. 20 is a timing chart illustrating one example of detection of the timing C.

Detection of the timing C will be described by using FIG. 19 and FIG. 20. FIG. 19 is a block diagram illustrating one example of a circuit which detects the timing C. FIG. 20 is a timing chart illustrating one example of detection of the timing C.

The current monitor circuit 22 includes a comparator 221 which compares the voltage $V_{SE}$ with a reference voltage (Vmon (state2)) which is set in advance. The reference voltage (Vmon (State2)) is a voltage having a value corresponding to a current value on the basis of which the current $I_{SE}$ begins flowing. Incidentally, although the comparator 221 compares a voltage which is input into it with the reference voltage, the input voltage and the threshold voltage vary depending on the operation mode, the state and so forth and therefore the current monitor circuit 22 is configured to switch between functions in accordance with a state signal and so forth.

The state machine control circuit 214 includes a first timer (Timer) TM1 which starts counting of the clock signal (Clock) when a signal which is input into a start (Start) terminal is asserted and stops counting when a signal which is input into a stop (Stop) terminal is asserted. A first enable signal (Enable1) is input into the start (Start) terminal and a current monitor output signal (CMO) which is asserted when the above-described voltages mutually match in a result of the comparison by the comparator 221 is input into the stop (Stop) terminal. Since the first enable signal (Enable1) is asserted when the first state (State1) is started and the current monitor output signal (CMO) is asserted when the second state (State2) is started, it is possible to measure a time-period ($T_{ONA}$) of the first state (State1). Incidentally, the state machine control circuit 214 includes a register (not illustrated) which stores the time-period $T_{ONA}$.

Figure 21:
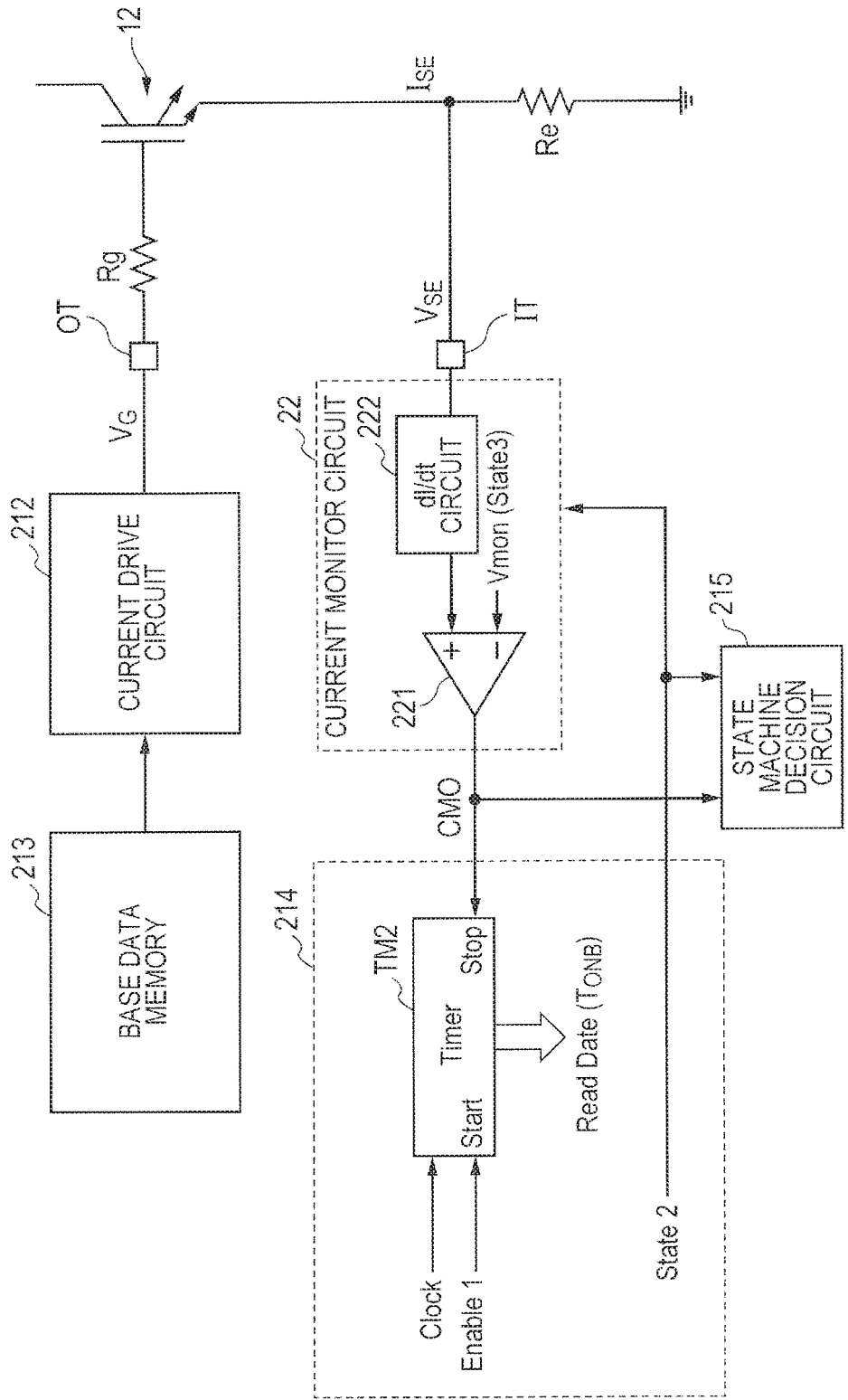
FIG. 21 is a block diagram illustrating one example of a configuration of a circuit which detects a timing D.

Detection of the timing D will be described by using FIG. 21. FIG. 21 is a block diagram illustrating one example of a circuit which detects the timing D.

The current monitor circuit 22 includes a differential circuit (a dI/dt circuit) 222 which detects a change in slope of the voltage $V_{SE}$ in addition to the comparator 221. The comparator 221 compares an output voltage from the differential circuit 222 with a reference voltage (Vmon (State3)) which is set in advance. The reference voltage Vmon (State3) is a voltage indicating that the slope of the current $I_{SE}$ ($V_{SE}$) changes.

The state machine control circuit 214 includes a second timer (Timer) TM2 which starts counting of the clock signal (Clock) when the signal which is input into its start (Start) terminal is asserted and stops counting when a signal which is input into its stop (Stop) terminal is asserted. The first enable signal (Enable1) is input into the start (Start) terminal and the current monitor output signal (CMO) which is asserted when the above-described voltages mutually match in a result of the comparison by the comparator 221 is input into the stop (Stop) terminal. Since the first enable signal (Enable1) is asserted when the first state (State1) is started and the current monitor output signal (CMO) is asserted when the third state (State3) is started, it is possible to measure a total time-period ($T_{ONB}$) of the first state (State1) and the second state (State2). Incidentally, the state machine control circuit 214 includes a register (not illustrated) which stores the total time-period $T_{NOB}$. In addition, a gate circuit and so forth which permits and inhibits passage of the current monitor output signal (CMO) depending on the state signal and so forth is inserted between the current monitor circuit 22 and the timer TM2 in a manner that the current monitor output signal (CMO) in FIG. 21 is not input into the stop (Stop) terminal of the timer TM2.

Figure 22:
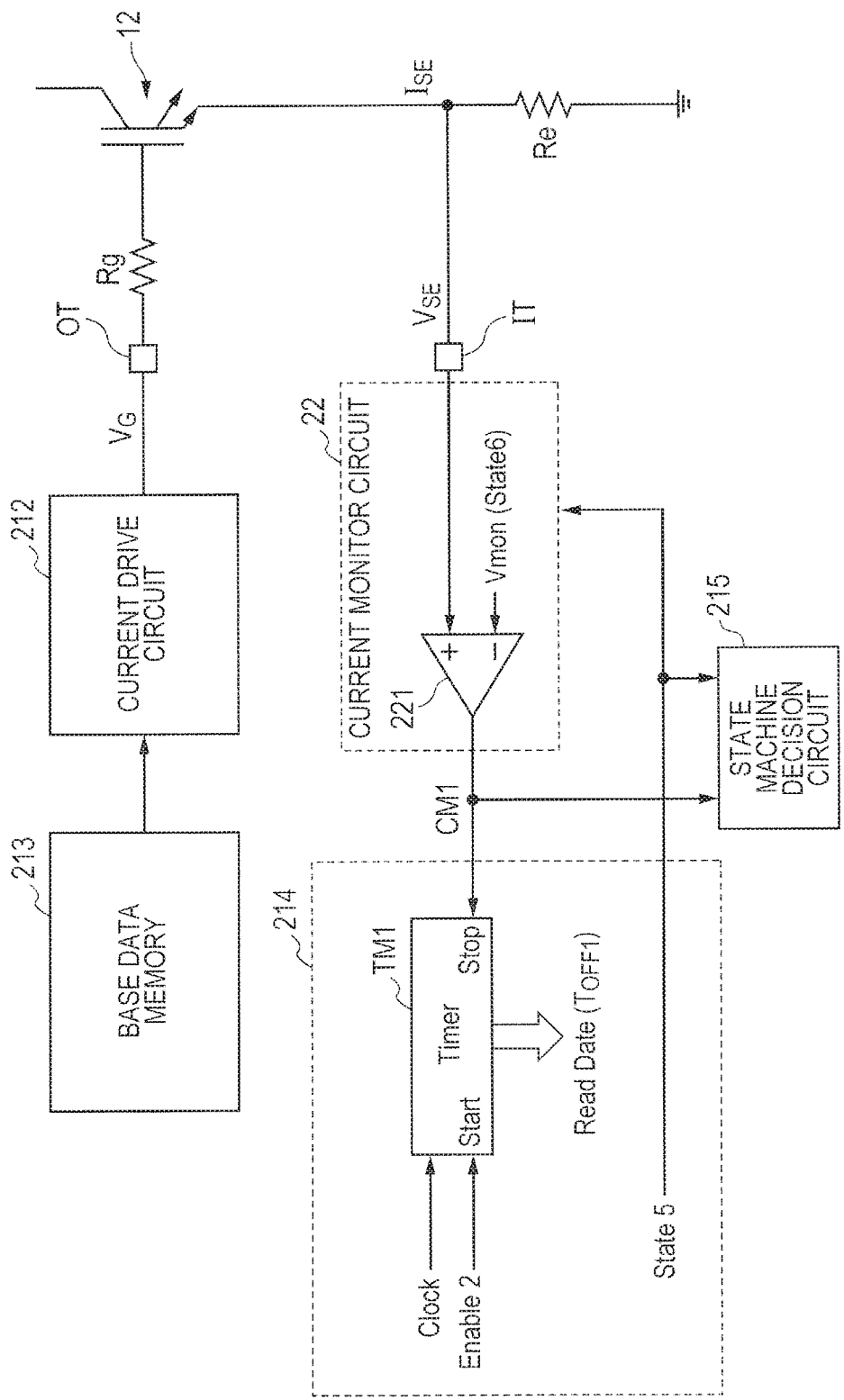
FIG. 22 is a block diagram illustrating one example of a configuration of a circuit which detects a timing G.
Figure 23:
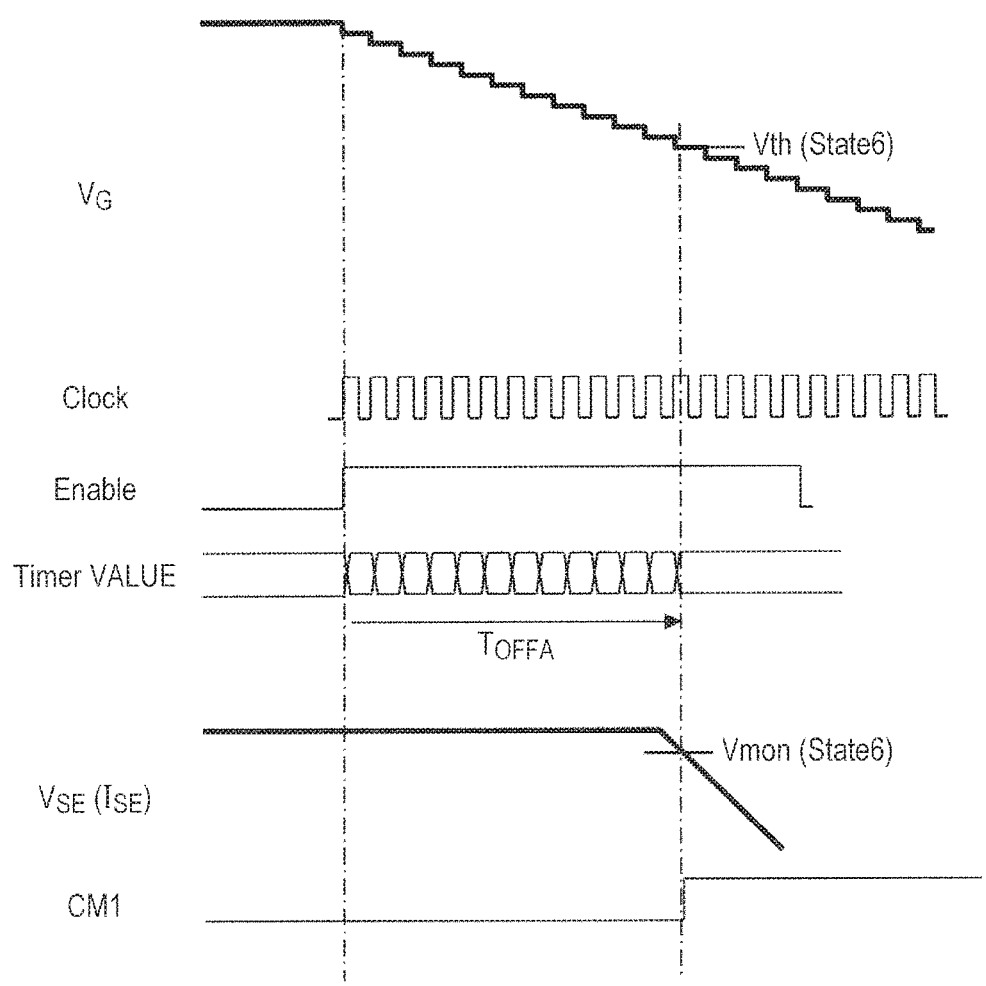
FIG. 23 is a timing chart illustrating one example of detection of the timing G.

Detection of the timing G will be described by using FIG. 22 and FIG. 23. FIG. 22 is a block diagram illustrating one example of a circuit which detects the timing G. FIG. 23 is a timing chart illustrating one example of detection of the timing G. Incidentally, it is necessary to increase the gate signal voltage ($V_G$) up to a maximum voltage in advance for detection of the timing G.

The comparator 221 of the current monitor circuit 22 compares the voltage $V_{SE}$ with a threshold voltage (Nmon (State6)) which is set in advance. The reference voltage Vmon (State6) is a voltage having a value corresponding to a current value on the basis of which the current $I_{SE}$ begins decreasing.

A second enable signal (Enable2) is input into the start (Start) terminal of the first timer (Timer) TM1 of the state machine control circuit 214 and the current monitor output signal (CMO) which is asserted when the above-described voltages mutually in the result of comparison by the comparator 221 is input into the stop (Stop) terminal of the first timer (Timer) TM1. Since the second enable signal (Enable2) is asserted when the fifth state (State5) is started and the current monitor output signal (CMO) is asserted when the sixth state (State6) is started, it is possible to measure a time-period ($T_{OFFA}$) of the fifth state (State5). Incidentally, the state machine control circuit 214 includes a register (not illustrated) which stores the time-period $T_{OFFA}$.

Figure 24:
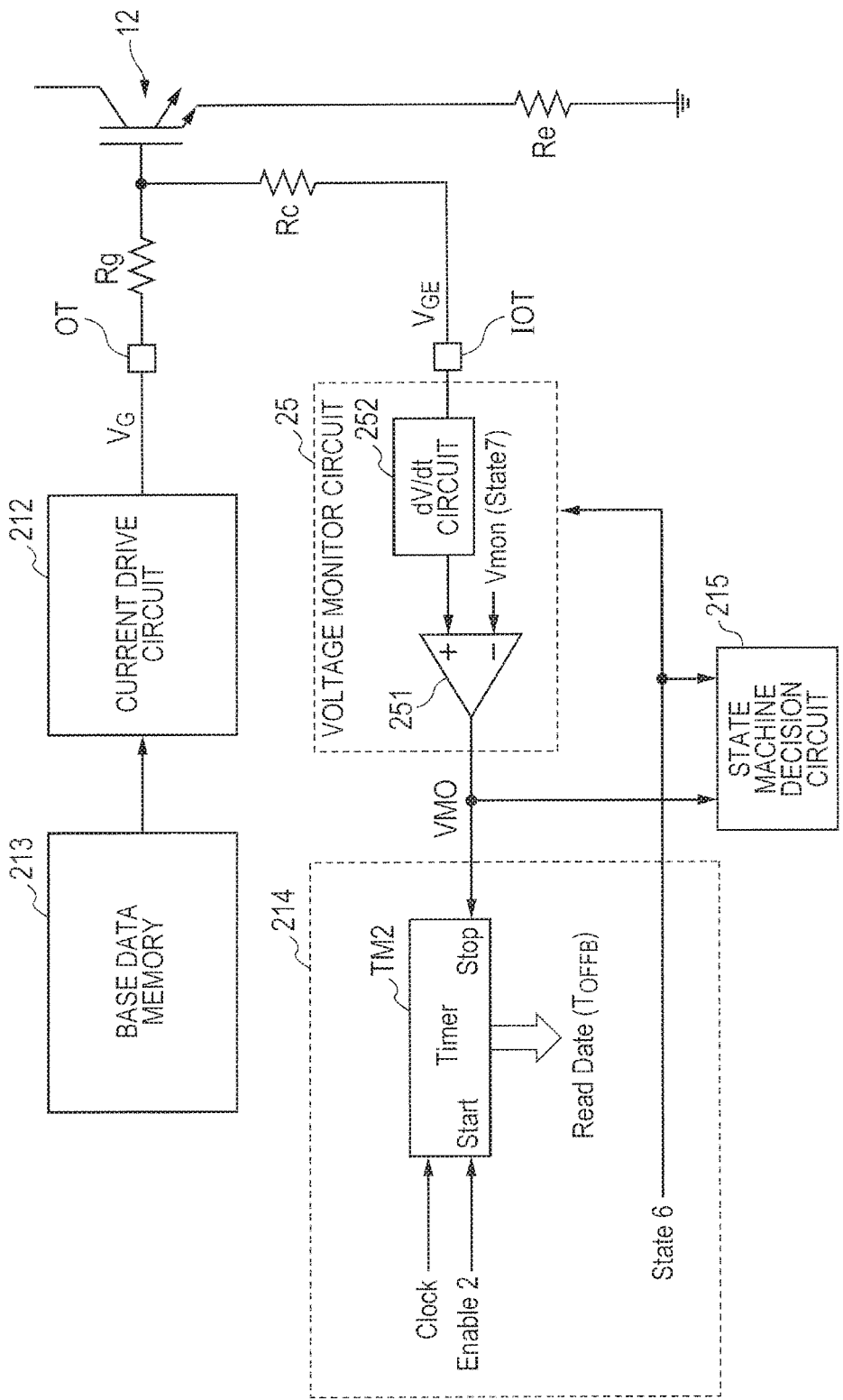
FIG. 24 is a block diagram illustrating one example of a configuration of a circuit which detects a timing H.

Detection of the timing H will be described by using FIG. 24. FIG. 24 is a block diagram illustrating one example of a circuit which detects the timing H.

The voltage monitor circuit 25 includes a differential circuit (a dV/dt circuit) 252 which detects a change in slope of the voltage $V_{GE}$ and a comparator 251 which compares an output voltage of the differential circuit 252 with a reference voltage (Vmon (State7)) which is set in advance. The reference voltage Vmon (State7) is a voltage indicating that the slope of the voltage $V_{GE}$ changes.

The second enable signal (Enable2) is input into the start (Start) terminal of the second timer (Timer) TM2 of the state machine control circuit 214 and a voltage monitor output signal (VMO) which is asserted when the above-described voltages mutually match in the result of comparison by the comparator 251 is input into the stop (Stop) terminal of the second timer (Timer) TM2. Since the second enable signal (Enable2) is asserted when the fifth state (State5) is started and the voltage monitor output signal (VMO) is asserted when the seventh state (State7) is started, it is possible to measure a total time-period ($T_{OFFB}$) of the fifth state (State5) and the sixth state (State5). Incidentally, the state machine control circuit 214 includes a register (not illustrated) which stores the time-period $T_{OFFB}$.

Figure 25:
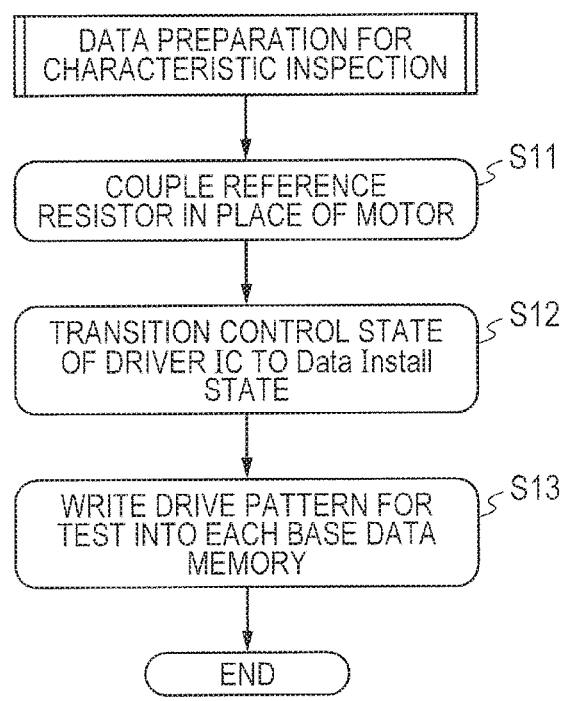
FIG. 25 is a flowchart illustrating one example of preparation processing for characteristic inspection.
Figure 26:
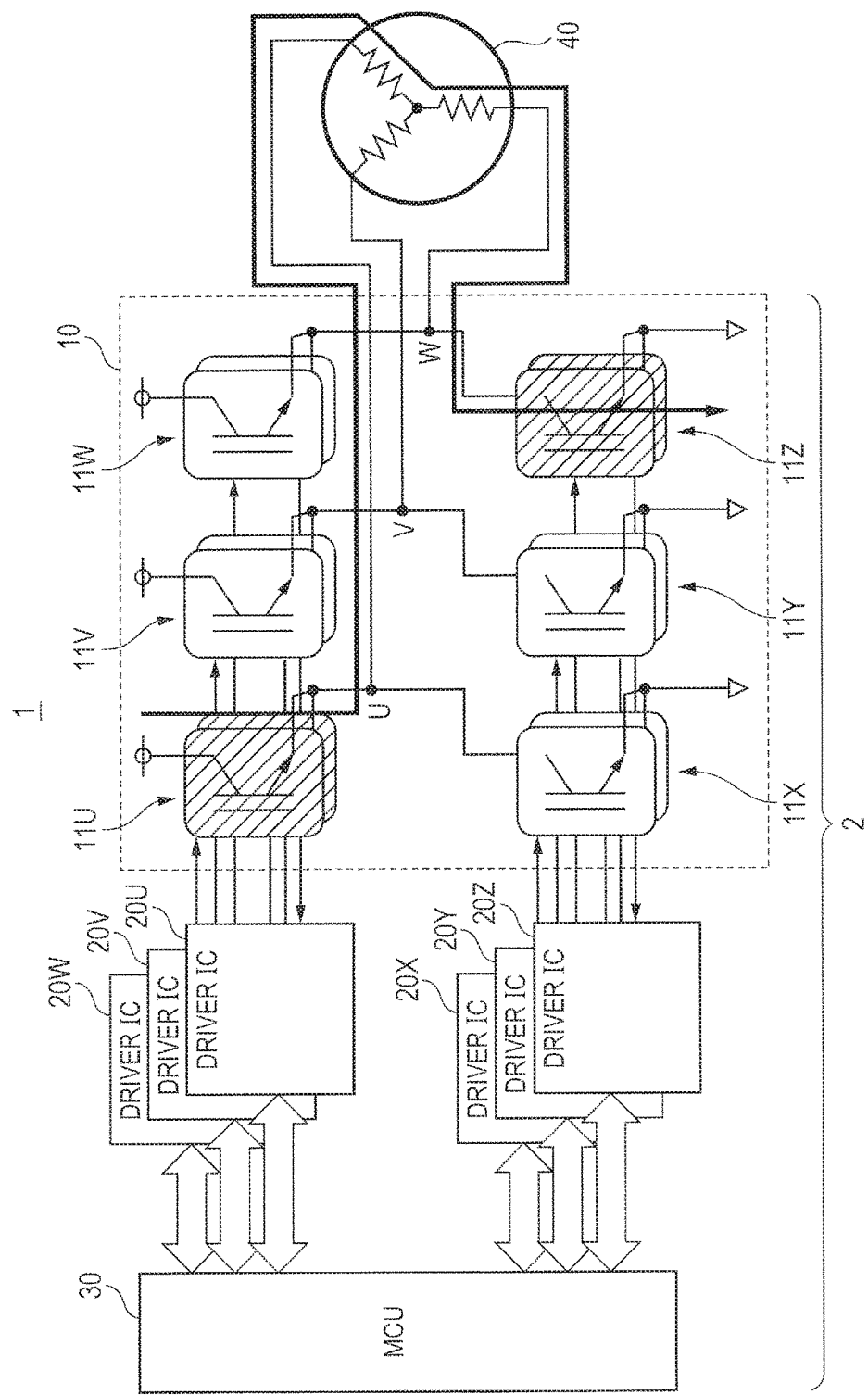
FIG. 26 is a block diagram illustrating one example of a configuration in characteristic inspection.
Figure 27:
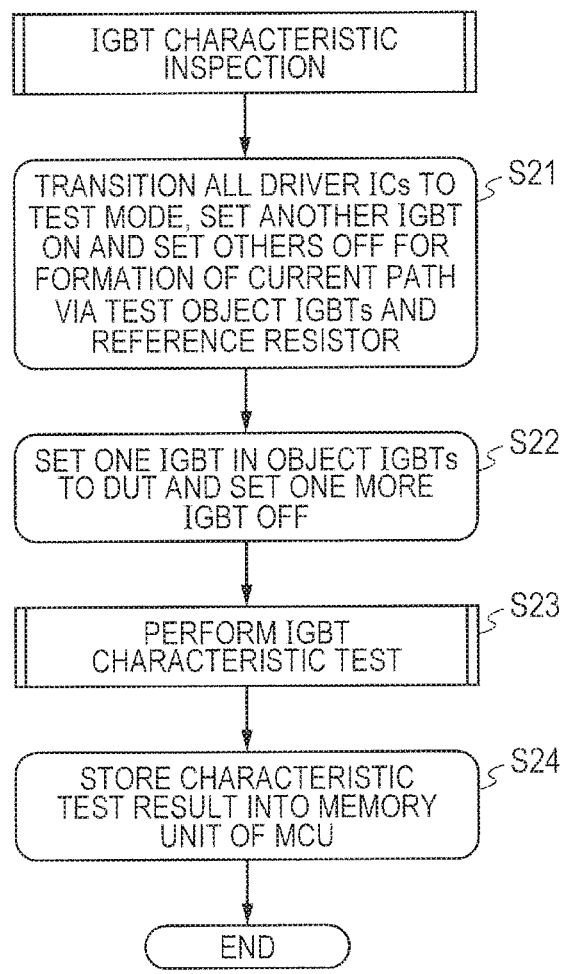
FIG. 27 is a flowchart illustrating one example of IGBT characteristic inspection processing.
Figure 28:
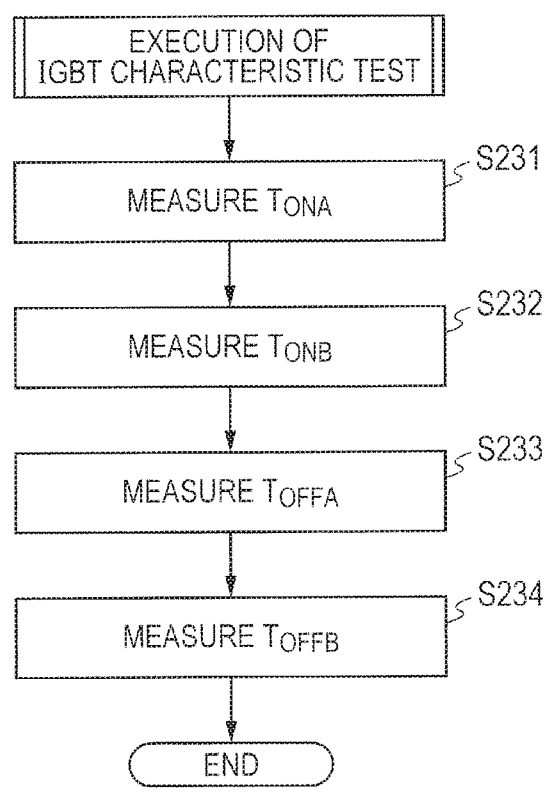
FIG. 28 is a flowchart illustrating one example of an IGBT characteristic test.
Figure 29:
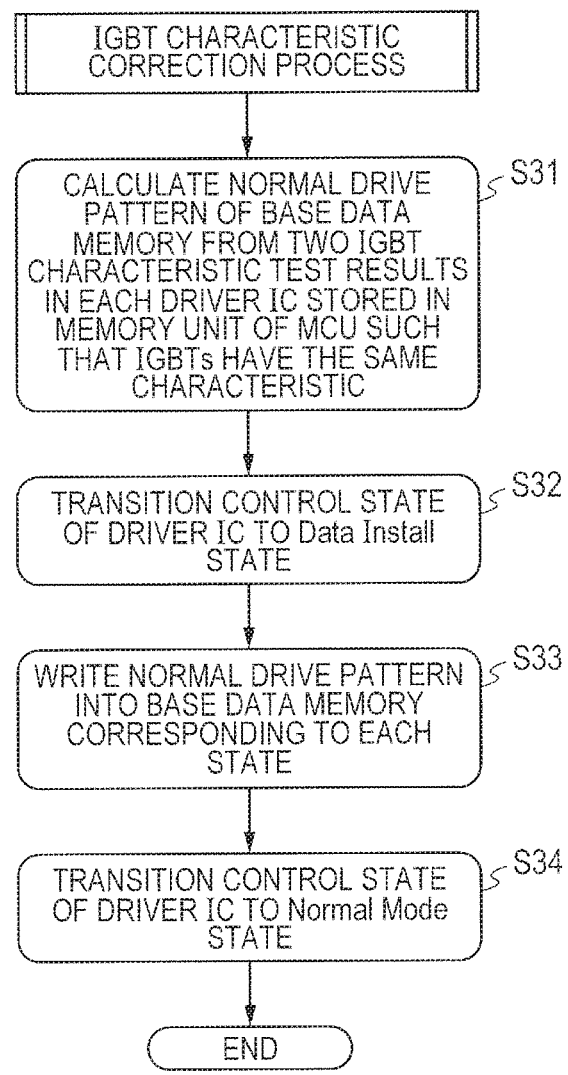
FIG. 29 is a flowchart illustrating one example of IGBT characteristic correction processing.

Then, preparation processing in the power conversion apparatus 2 according to the embodiment will be described by using FIG. 25 to FIG. 30. FIG. 25 is a flowchart illustrating one example of preparation processing for characteristic inspection. FIG. 26 is a block diagram illustrating one example of a configuration in characteristic inspection. FIG. 27 is a flowchart illustrating one example of IGBT characteristic inspection processing. FIG. 28 is a flowchart illustrating one example of an IGBT characteristic test. FIG. 29 is a flowchart illustrating one example of IGBT characteristic correction processing.

The preparation processing for characteristic inspection will be described by using FIG. 25 and FIG. 26.

Step S11: As illustrated in FIG. 26, a reference resistor is coupled to the power conversion apparatus 2 in place of the motor and thereby an electric motor system for characteristic inspection is configured.

Step S12 : The CPU 31 issues a "ReProgram" command and makes the control states (the drive control circuits) of all the driver ICs 20U, 20V, 20W, 20Y and 20Z transition to the "Data Install" state.

Step S13: The CPU 31 writes a drive pattern for test into each of the base data memories 213 1 to 213 4 of each drive control circuit of each driver IC 20. The CPU 31 shifts to the IGBT characteristic inspection processing in FIG. 27.

The IGBT characteristic inspection processing will be described by using FIG. 27 and FIG. 28.

Step S21: The CPU 31 issues a "Test" command and makes all the driver ICs 20U, 20V, 20W, 20X, 20Y and 20Z transition to the test mode ("Test Mode") state. For example, in a case where the IGBT 12 of the switching element 11 is set as a test object, the state is shifted to the second test state in a manner that, for example, the IGBT 12 of the switching element 11U is turned on and shifted to the fourth test state in a manner that the IGBTs 12 of other switching elements 11V, 11W, 11X and 11Y are turned off in order to form a current passage together with the IGBT 12 of the switching element 11U via the reference resistor.

Step S22: The state is shifted to the fourth test state in a manner that one IGBT 12 in the test object switching element 11 is set as a DUT (Device Under Test) and one more IGBT 12 is turned off.

Step S23: Such an IGBT characteristic test as illustrated in FIG. 28 is performed.

Step S231: The driver IC 20U measures the time-period $T_{ONA}$ of the IGBT 12 in the first test state and stores the measured value into the register.

Step S232: The driver IC 20U measures the time-period $T_{ONB}$ of the IGBT 12 in the first test state and stores the measured value into the register.

Step S233: The driver IC 20U measures the time-period $T_{OFFA}$ of the IGBT 12 in the third test state and stores the measured value into the register.

Step S234 : The driver IC 20U measures the time-period $T_{OFFB}$ of the IGBT 12 in the third test state and stores the measured value into the register.

Step S24: The CPU 31 stores results of the IGBT characteristic test ($T_{ONA}$, $T_{ONB}$, $T_{OFFA}$, and $T_{OFFB}$) stored in the register into the memory unit 32 in the MCU 30.

Step S21 to step S24 are performed on all the IGBTs 12. The process proceeds to the IGBT characteristic correction processing in FIG. 28.

Figure 30:
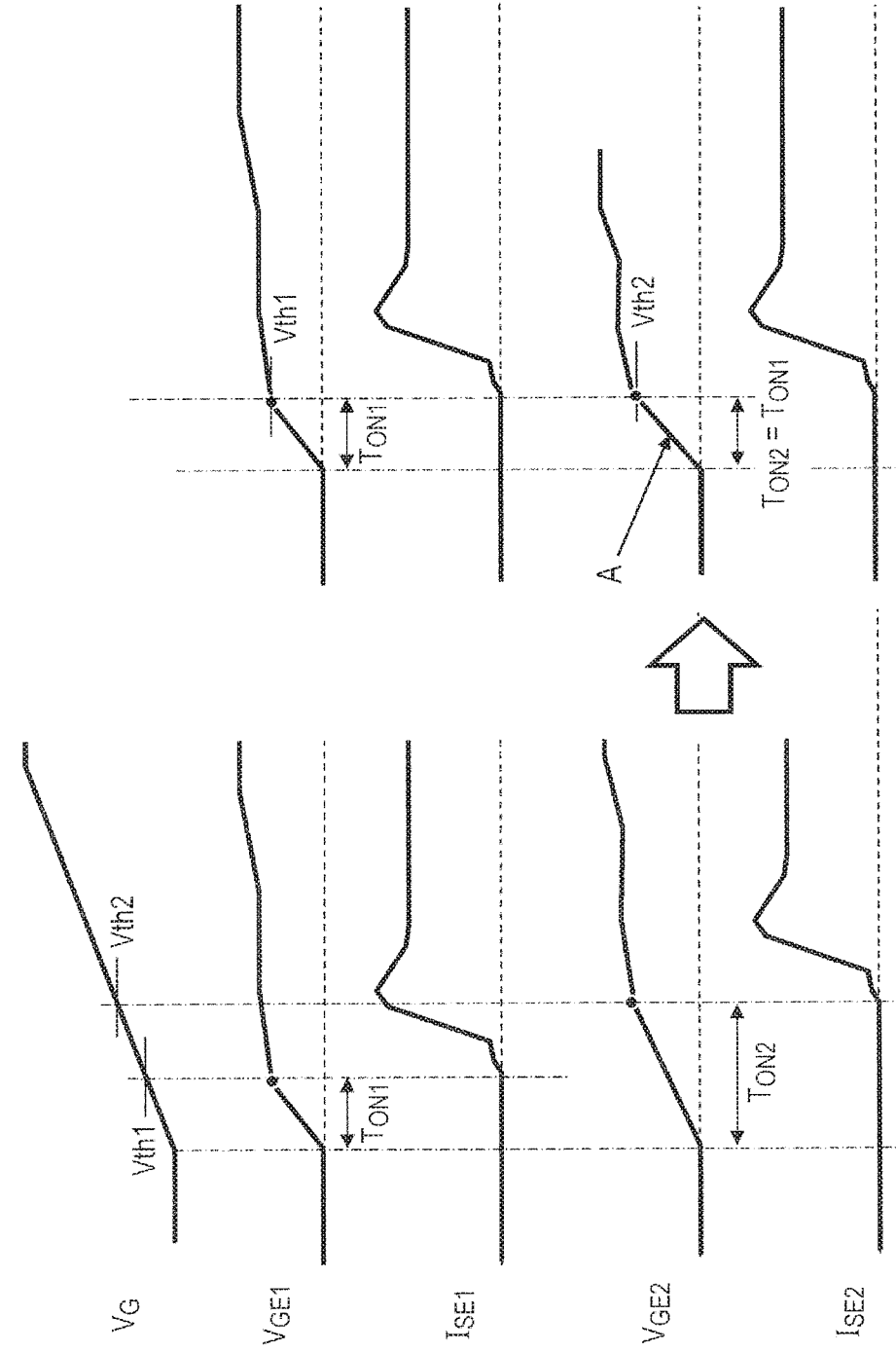
FIG. 30 is a timing chart illustrating one example of correction of a deviation in characteristic between the IGBTs having different characteristics.

The IGBT characteristic correction processing will be described by using FIG. 29 and FIG. 30. FIG. 29 is a flowchart illustrating one example of the IGBT characteristic correction processing. FIG. 30 is a timing chart illustrating one example of correction of a deviation in characteristic between the IGBTs 12 having different characteristics. In FIG. 30, the left-side timing chart illustrates a case where the values Vth of the two IGBTs 12 are different from each other and the right-side timing chart illustrates a case where the deviation in characteristic is corrected.

Step S31: A current drive table for the normal mode to be stored into the base data memory 213 is calculated from the IGBT characteristic test results ($T_{ONA}$, $T_{ONB}$, $T_{OFFA}$, $T_{OFFB}$) performed on the two IGBTs 12 in each of the driver ICs 20U, 20V, 20W, 20X, 20Y and 20Z which are stored in the memory unit 32 of the MCU 30 in a manner that the two IGBTs 12 have the same characteristic. This calculation is performed by taking that a ratio of the drive capability of the current drive circuit 212 in the test mode to the drive capability of the current drive circuit 212 in the normal mode is set to a predetermined value into consideration. Incidentally, as illustrated in FIG. 30, in a case where the gate signal voltage ($V_G$) output from the drive control circuit 21 is applied to the IGBTs 12_1 and 12_2, when the Vth characteristics of the IGBTs 12_1 and 12_2 are different from each other, waveforms of a gate terminal voltage ($V_{GE1}$) and a sense current ($I_{SE1}$) of the IGBT 12_1 become respectively different from waveforms of a gate terminal voltage ($V_{GE2}$) and a sense current ($I_{SE2}$) of the IGBT 12_2. When the reference voltage Vth1 of the IGBT 12_1 is lower than the reference voltage Vth2 of the IGBT 12_2, a turn-on time ($T_{ON1}$) of the IGBT 12_1 becomes shorter than a turn-on time ($T_{ON2}$) of the IGBT 12_2. In this case, the slope of the voltage $V_{GE2}$ is changed in a manner that the time $T_{ON2}$ is made shorter as denoted by A in FIG. 30 by increasing the capability (the driving current) for driving the gate of the IGBT 12_2 such that $T_{ON2}=T_{ON1}$ is established. Also in a case where a turn-off time ($T_{OFF1}$) of the IGBT 12_1 becomes shorter than a turn-off time ($T_{OFF2}$) of the IGBT 12_2, the slope of the voltage VGE2 is changed in a manner that the time $T_{OFF2}$ is made shorter as in the case of A in FIG. 30 by increasing the capability (the driving current) for driving the gate of the IGBT 12_2 such that $T_{OFF2}=T_{OFF1}$ is established.

Step S32: The CPU 31 issues the "ReProgram" command and makes the control states (the drive control circuits) of all the driver ICs 20U, 20V, 20W, 20X, 20Y and 20Z transition to the "Data Install" state.

Step S33: The CPU 31 writes the drive pattern for the normal mode into each of the base data memories 213_1 to 213_4 of each drive control circuit 21 of each driver IC.

Step S34: the CPU issues the "Normal" command and makes the control states (the drive control circuits) of all the driver ICs 20U, 20V, 20W, 20X, 20Y and 20Z transition to the "Normal Mode" state.

MODIFIED EXAMPLES

In the following, several representative modified examples will be exemplified. In the following description on the modified examples, the same numerals as those in the embodiment may be used for parts having configurations and functions similar to those described in the above-described embodiment. Then, in description of these parts, description in the above-described embodiment may be appropriately invoked in a technically consistent range. In addition, part of the above-described embodiment and all or part of the plurality of modified examples may be appropriately and compositely applicable in the technically consistent range.

MODIFIED EXAMPLE 1

Figure 31:
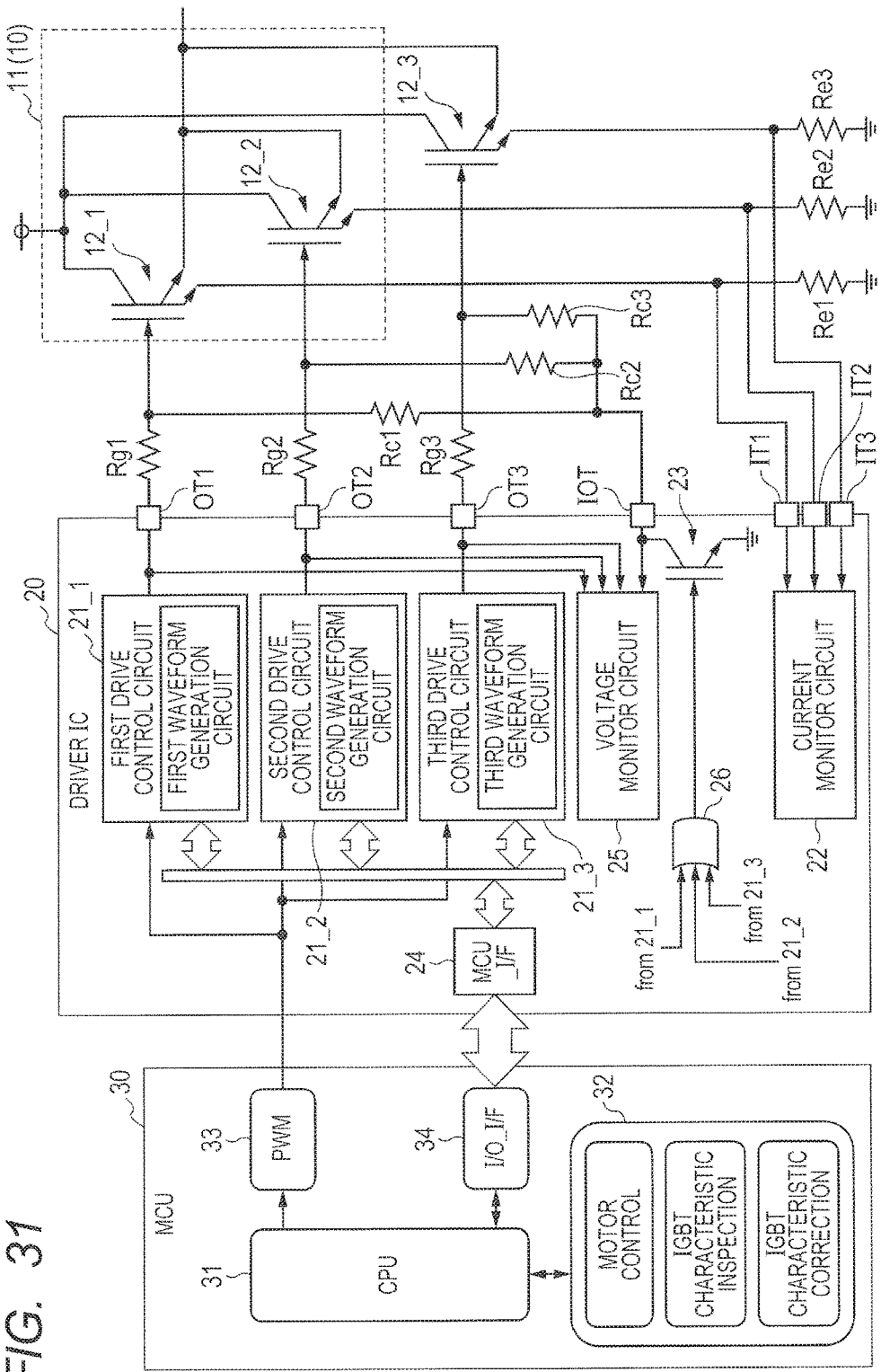
FIG. 31 is a block diagram illustrating one example of a configuration of a power conversion apparatus according to a modified example 1.

Then, a configuration of the power conversion apparatus 2 according to a modified example 1 will be described by using FIG. 31. FIG. 31 is a block diagram illustrating one example of the configuration of the power conversion apparatus 2 according to the modified example 1. Although, in FIG. 31, description will be made by illustrating only one phase of the power conversion apparatus 2, the same is true of the other phases. In the following, in a case where it is not necessary to distinguish the respective switching elements 11U, 11V, 11W, 11X, 11Y and 11Z from one another, the switching elements 11U to 11Z will be described as a switching element 11.

In the power conversion apparatus 2 according to the modified example 1, three IGBTs 12 which configure the switching element 11 are coupled in parallel with one another and the driver IC 20 includes three drive control circuits 21 in association with installation of the three IGBTs 12. However, other configurations and operations are similar to those in the embodiment. Points which are different from those in the embodiment will be mainly described.

The power conversion apparatus 2 according to the modified example 1 includes the inverter circuit 10 having the switching element 11, the driver IC 20, the control circuit 30 and so forth.

The switching element 11 is configured by coupling the IGBT 12_1, the IGBT 12_3 and an IGBT12_3 in parallel with one another.

The driver IC 20 includes the first drive control circuit 21_1 which drives the IGBT 12_1, the second drive control circuit 21_2 which drives the IGBT 12_2, a third drive control circuit 21_3 which drives the IGBT 12_3 and the current monitor circuit 22 which detects the driving currents of the IGBTs 12_1, 12_2 and 12_3. In addition, the driver IC 20 includes the cut-off circuit 23 which cuts off driving of the gates of the IGBTs 12_1, 12_2 and 12_3, the MCU_I/F 24 which interfaces with the control circuit 30, the voltage monitor circuit 25 which detects the gate voltages of the IGBTs 12_1, 12_2 and 12_3 and the logic circuit 26 which controls the cut-off circuit 23. The driver IC 20 includes the above-described constitutional elements in one semiconductor chip. Each of the first drive control circuit 21_1, the second drive control circuit 21_2 and the third drive control circuit 21_3 generates the drive signal used for driving the gate electrode of each IGBT 12 for the purpose of turning each of the IGBTs 12_1, 12_2 and 12_3 on and off on the basis of the PWM signal from the control circuit 30. The logic circuit 26 is a circuit which makes an output high when any one of a signal from the first drive control circuit 21_1, a signal from the second drive control circuit 21_2 and a signal from the third drive control circuit 21_3 is asserted and is, for example, an OR circuit.

The gate resistor Rg1 is arranged between the first output terminal OT1 and the gate terminal of the IGBT 12_1, the gate resistor Rg2 is arranged between a second output terminal OT2 and the gate terminal of the IGBT 12_2 and a gate resistor Rg3 is arranged between a third output terminal OT3 and a gate terminal of the IGBT 12_3. The current detection resistors Re1 and Re2 and a current detection resistor Re3 are coupled between the input terminal IT1 and a sense emitter terminal of the IGBT 12_1, between the input terminal IT2 and a sense emitter terminal of the IGBT 12_2 and between an input terminal IT3 and a sense emitter terminal of the IGBT 12_3 respectively. The cut-off resistors Rc1 and Rc2 and a cut-off resistor Rc3 are coupled between the input/output terminal IOT and the gate terminal of the IGBT 12_1, between the input/output terminal IOT and the gate terminal of the IGBT 12_2 and between the input/output terminal IOT and the gate terminal of the IGBT 12_3 respectively.

Although an example that the three IGBTs 12 which configure the switching element 111 are coupled in parallel with one another is described in the modified example 1, the number of the IGBTs 12 is not limited to three and four or more IGBTs 12 may be arranged. In this case, the control circuits 21 of the number which is the same as that of the IGBTs 12 are arranged.

MODIFIED EXAMPLE 2

Figure 32:
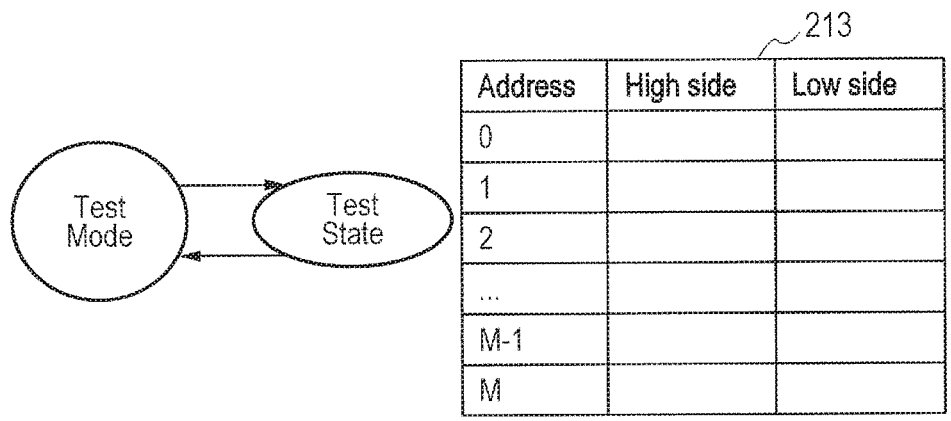
FIG. 32 is a diagram illustrating one example of a relation between a state in the test mode and the base data memory according to a modified example 2.

The base data memory 213 in the test mode according to a modified example 2 will be described by using FIG. 32. FIG. 32 is a diagram illustrating one example of a relation between the states in the test mode and the base data memory 213.

In the embodiment, the four base data memories 213_1, 2133_2, 213_3 and 213_4 are arranged in correspondence with the four test states as illustrated in FIG. 14. However, in the modified example 2, data in one base data memory 213 is rewritten by the CPU 31 thereby to cope with the four test states. Thereby, it is possible to reduce the number of HW resources.

The modified example 2 may be also applied to, for example, the modified example 1.

MODIFIED EXAMPLE 3

A modified example of the IGBT characteristic correction processing will be described by using FIG. 33 and FIG. 34.

Figure 33:
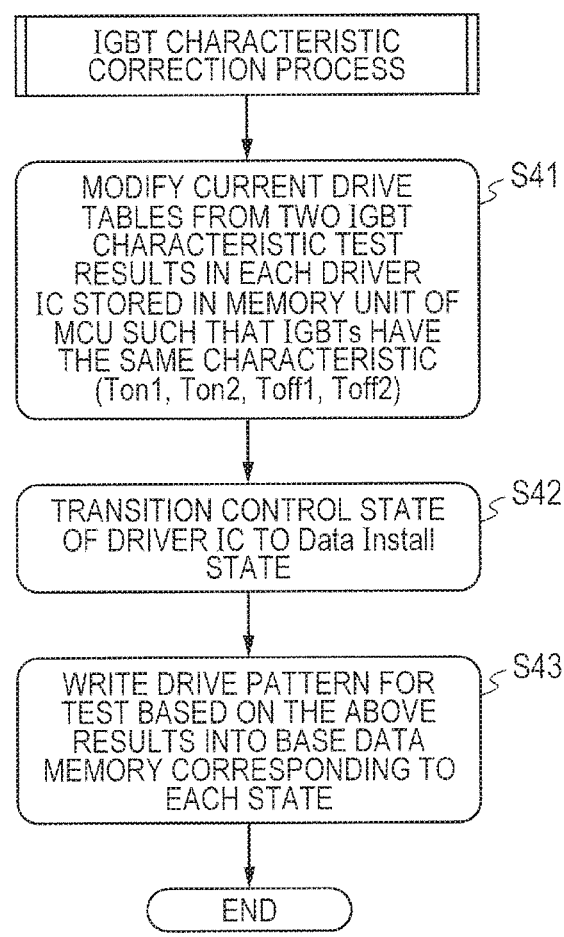
FIG. 33 is a flowchart illustrating one example of IGBT characteristic correction processing according to a modified example 3.
Figure 34:
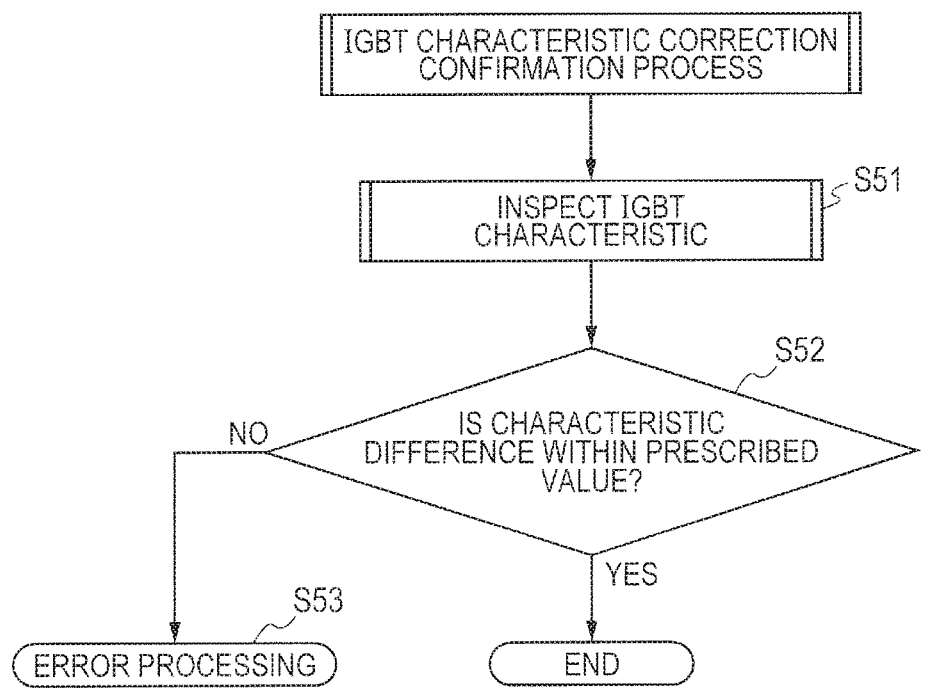
FIG. 34 is a flowchart illustrating one example of IGBT characteristic correction confirmation processing according to the modified example 3.

FIG. 33 is a flowchart illustrating one example of the IGBT characteristic correction processing according to a modified example 3. FIG. 34 is a flowchart illustrating one example of IGBT characteristic correction confirmation processing. In the modified example 3, the IGBT characteristic correction processing in FIG. 33 and the IGBT characteristic correction conformation processing in FIG. 34 are performed in place of the IGBT characteristic correction processing in FIG. 29 which comes after the IGBT characteristic inspection in FIG. 27. It is possible to confirm the IGBT characteristic correction by controlling the current drive circuit 212 in accordance with the drive capability information in the base data memory 213 in the test mode.

Step S41: The current drive table for the base data memory 213 is modified from the characteristic test results ($T_{ONA}$, $T_{ONB}$, $T_{OFFA}$ and $T_{OFFB}$) of the two IGBTs 12 in each of the driver ICs 20U, 20V, 20W, 20X, 20Y and 20Z stored in the memory unit 32 of the MCU 30 such that the two IGBTs 12 have the same characteristic. For example, in a case where $T_{ONA}(1)<T_{ONA}(2)$ in which $T_{ONA}(1)$ is $T_{ONA}$ of the IGBT 12_1 and $T_{ONA}(2)$ is $T_{ONA}$ of the IGBT 12_2, the drive capability of the IGBT 12_2 is increased or the drive capability of the IGBT 12_1 is decreased.

Step S42: The CPU 31 issues the "ReProgram" command and makes the control states (the drive control circuits) of all the driver ICs 20U, 20V, 20W, 20X, 20Y and 20Z transition to the "Dara Install" state.

Step S43: The CPU 31 writes the drive pattern for test into each of the base data memories 213_1 to 213_4 of each drive control circuit 21 of each driver IC 20. The CPU 31 shifts to the IGBT characteristic correction confirmation processing in FIG. 31.

The IGBT characteristic correction confirmation processing will be described by using FIG. 31.

Step S51: The IGBT characteristic inspection (step S21 to step S24) is performed on all the IGBTs 12_1 to 12_3.

Step S52: The CPU 31 decides whether a difference in characteristic obtained from the IGBT characteristic test results is within a prescribed value. In a case of YES (the difference is within the prescribed value), the CPU 31 shifts to the IGBT characteristic correction processing in FIG. 29. In a case of NO (the difference is not within the prescribed value), the CPU 31 shifts to step S53.

Step S53: The CPU 31 performs error processing.

MODIFIED EXAMPLE 4

Figure 36:
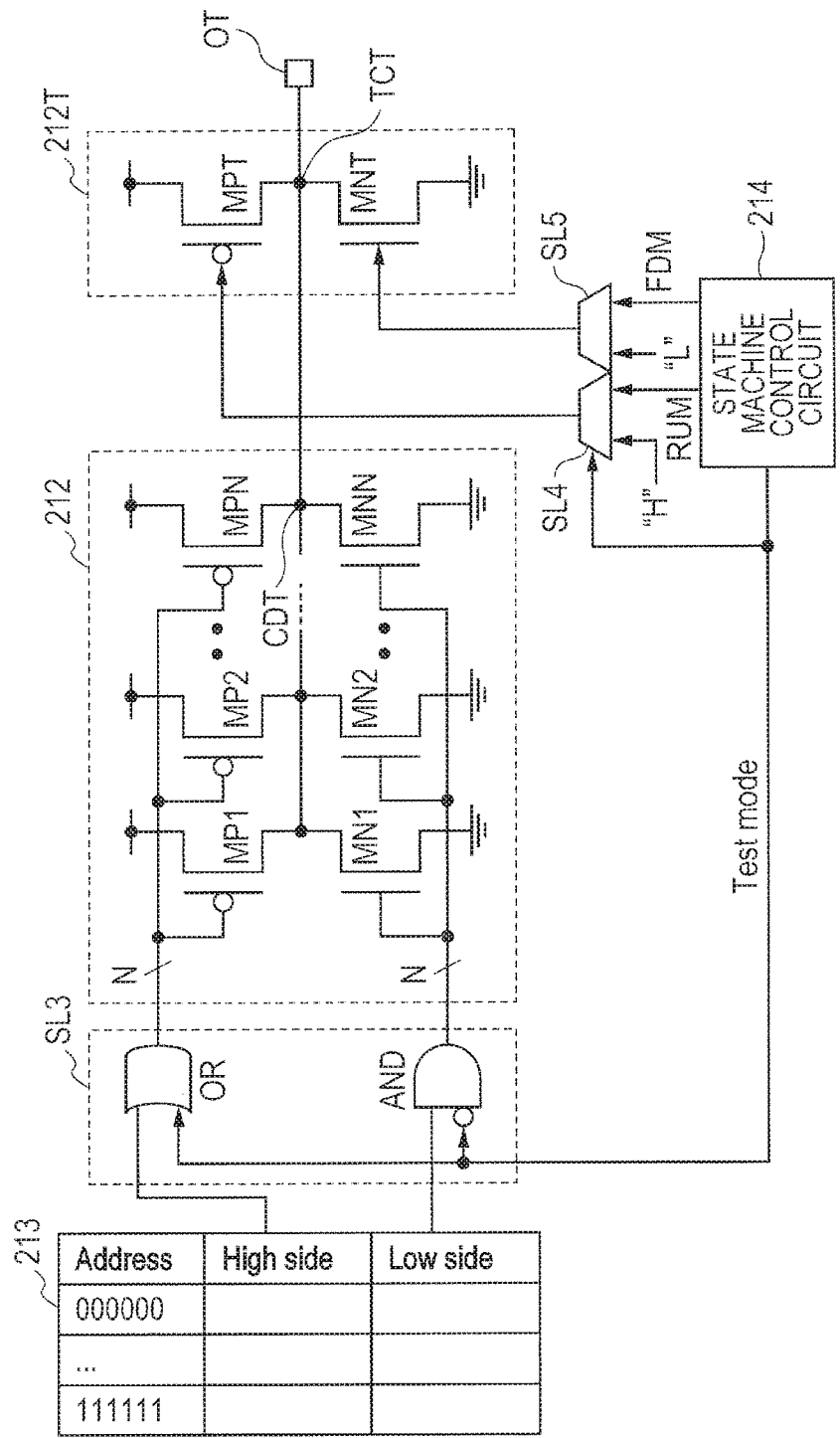
FIG. 36 is a block diagram illustrating one example of a configuration of a waveform generation circuit according to the modified example 4.

A drive control circuit according to a modified example 4 will be described by using FIG. 35 and FIG. 36. FIG. 35 is a block diagram illustrating one example of a configuration of the drive control circuit according to the modified example 4. FIG. 36 is a block diagram illustrating one example of a configuration of a waveform generation circuit according to the modified example 4.

In the embodiment, one waveform generation circuit 211 is used in common in the normal mode and the test mode and the drive capability of the current drive circuit 212 is switched depending on data in the base data memory 213. On the other hand, in the modified example 4, a waveform generation circuit for test mode 211T is arranged in addition to the waveform generation circuit for normal mode 211. Thereby, control in the test mode is simplified.

The waveform generation circuit for normal mode 211 includes the base data memory 213, the current drive circuit 212 and a selector SL3. The base data memory 213 and the current drive circuit 212 are configured similarly to those in the embodiment. The selector SL3 includes a two-input OR gate and a two-input AND gate and an inversion signal is input into one of the two input terminals of the AND gate.

The waveform generation circuit for test mode 211T includes a current drive circuit 212T and selectors SL4 and SL5. The waveform generation circuit for test mode 211T includes no base data memory unlike the waveform generation circuit for normal mode 211 and the drive capability of the current drive circuit 212T is fixed.

The current drive circuit 212T includes a PMOS transistor MPT arranged between a high reference potential source and a terminal TCT and NMOS transistors MNT1 to MNN arranged between a low reference potential source and the terminal TCT. The terminal TCT is coupled to the output terminal OT. The PMOS transistor MPT rises the gate signal voltage ($V_G$) and the NMOS transistor MNT falls the gate signal voltage ($V_G$). The current drive circuit 212T has the drive capability of a value which is sufficiently small in comparison with the drive capability of the current drive circuit 212 thereby to avoid steep rising of the gate signal waveform. The current drive circuit 212T is laid out by scaling down the current drive circuit 212 in a manner that the current ratio in the test mode and the normal mode has the specific value. Thereby, it becomes possible to accurately acquire the characteristic of each IGBT 12 at rising and falling of the gate signal.

In the test mode ("Test Mode") state, a test mode signal (Test mode) output from the state machine control circuit 214 becomes H (high), an output from the OR gate of the selector SL3 becomes H, an output from the AND gate of the selector SL3 becomes L (low) and an output from the terminal TCT of the current drive circuit 212 is brought into a floating state. In addition, output signals (RUM, FDM) from the state machine control circuit 214 are input into the current drive circuit 212T via the selectors SL4 and SL5 and the driving current is output to the output terminal OT. In a case where an H-level signal is output from the output terminal OT, the signal (RUM) which is input from the state machine control circuit 214 into the selector SL4 is the clock signal (Clock) which is input into a timer TM2 and so forth and the signal which is input into the selector SL5 is a L-level signal. Then, the clock signal (Clock) is output from the selector SL4 and the L-level signal is output from the selector SL5. Thereby, the output signal from the current drive circuit 212T stepwise rises in the period of the clock signal (Clock) similarly to the case in FIG. 20. In a case where the L-level signal is output from the output terminal OT, the signal which is input from the state machine control circuit 214 into the selector SL4 is the H-level signal and the signal (FDM) which is input from the state machine control circuit 214 into the selector SL5 is the clock signal (Clock). Then, the H-level signal is output from the selector SL4 and the clock signal (Clock) is output from the selector SL5. Thereby, the output signal from the current drive circuit 212T stepwise falls in the period of the clock signal (Clock) similarly to the case in FIG. 23.

In the normal mode ("Normal Mode") state, a test mode signal (Test Mode) which is output from the state machine control circuit 214 becomes L and it becomes possible to output the signal which is input from the base data memory 213 into the selector SL3 to the current drive circuit 212T. In addition, the selector SL4 outputs an H-level signal, the selector SL5 outputs a L-level signal, an output signal from the terminal TCT of the current drive circuit 212T is brought into the floating state and the driving current of the current drive circuit 212T is output to the output terminal OT.

It is possible to perform the characteristic inspection of the IGBT 12 of the power conversion apparatus 2 according to the modified example 4 similarly to that in the embodiment. Incidentally, since the waveform generation circuit for test mode 211T has no base data memory 213 and the drive capability of the current drive circuit 212T is fixed, step S12 and step S13 in FIG. 25 are not executed.

The modified example 4 is also applicable to, for example, the modified example 1.

MODIFIED EXAMPLE 5

Figure 37:
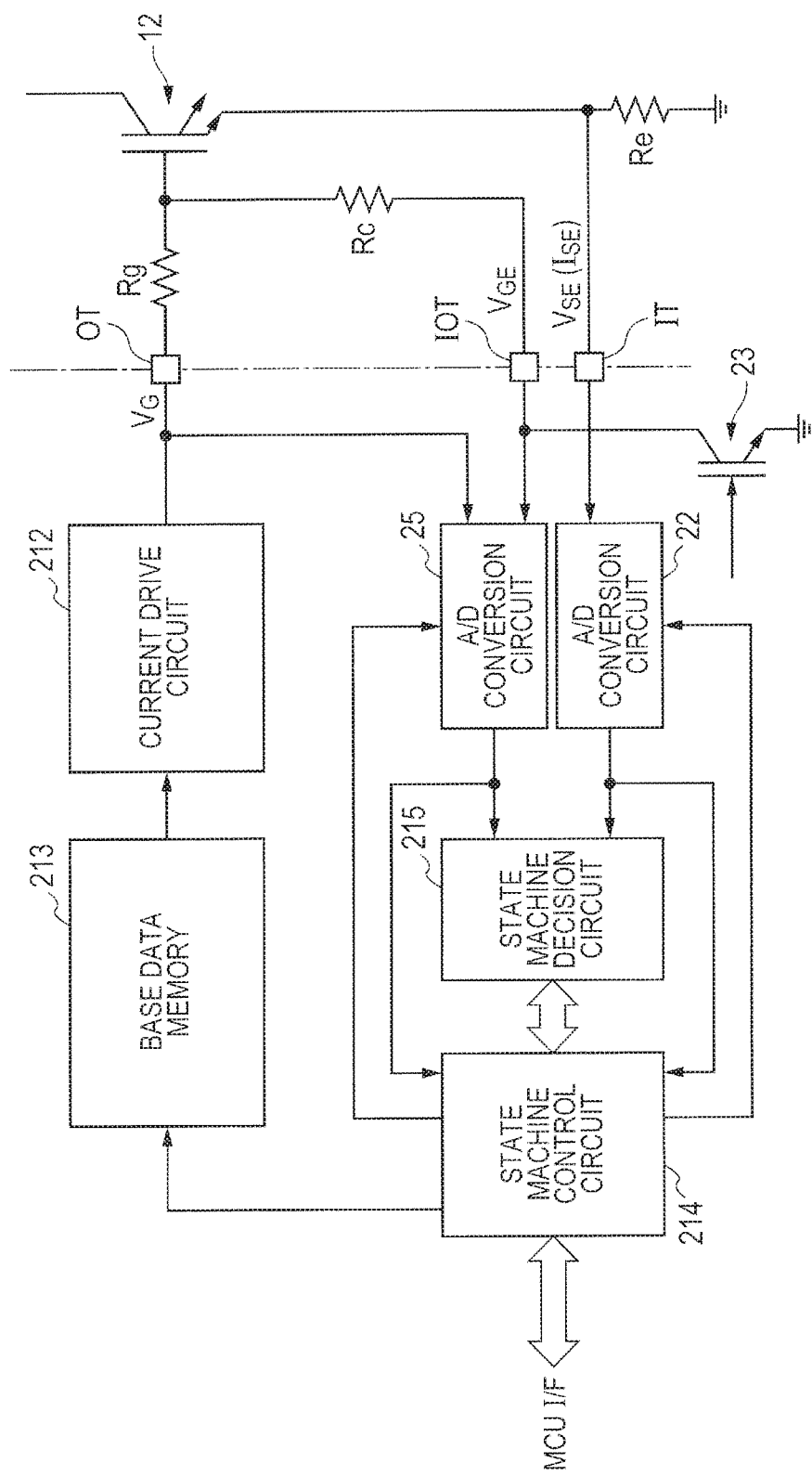
FIG. 37 is a block diagram illustrating one example of a circuit part in charge of characteristic inspection of the IGBT according to a modified example 5.

FIG. 37 is a block diagram illustrating one example of a circuit part in charge of the IGBT characteristic inspection according to a modified example 5.

Although the current monitor circuit 22 and the voltage monitor circuit 25 are configured by the comparators respectively in the embodiment and the modified example 4, the current monitor circuit 22 and the voltage monitor circuit 25 are configured by A/D conversion circuits respectively in the modified example 5. Other configurations and operations are similar to those in the embodiment.

The modified example 5 is also applicable to, for example, the modified examples 1 and 4.

APPLICATION EXAMPLE

Although mutually matching the ON-times and mutually matching the OFF-times of the plurality of the IGBTs 12 are described in the embodiment and the modified examples 1 to 5, it is also possible to apply the configurations in the embodiment and the modified examples 1 to 5 to countermeasures to overshoot of a transient response. In addition, the configurations of the embodiment and the modified examples 1 to 5 are also applicable to the countermeasures to the overshoot of the transient response in a case where each of the switching elements 11U, 11V, 11W, 11X, 11Y and 11Z is configured by one IGBT 12 (not parallel coupled).

Figure 38:
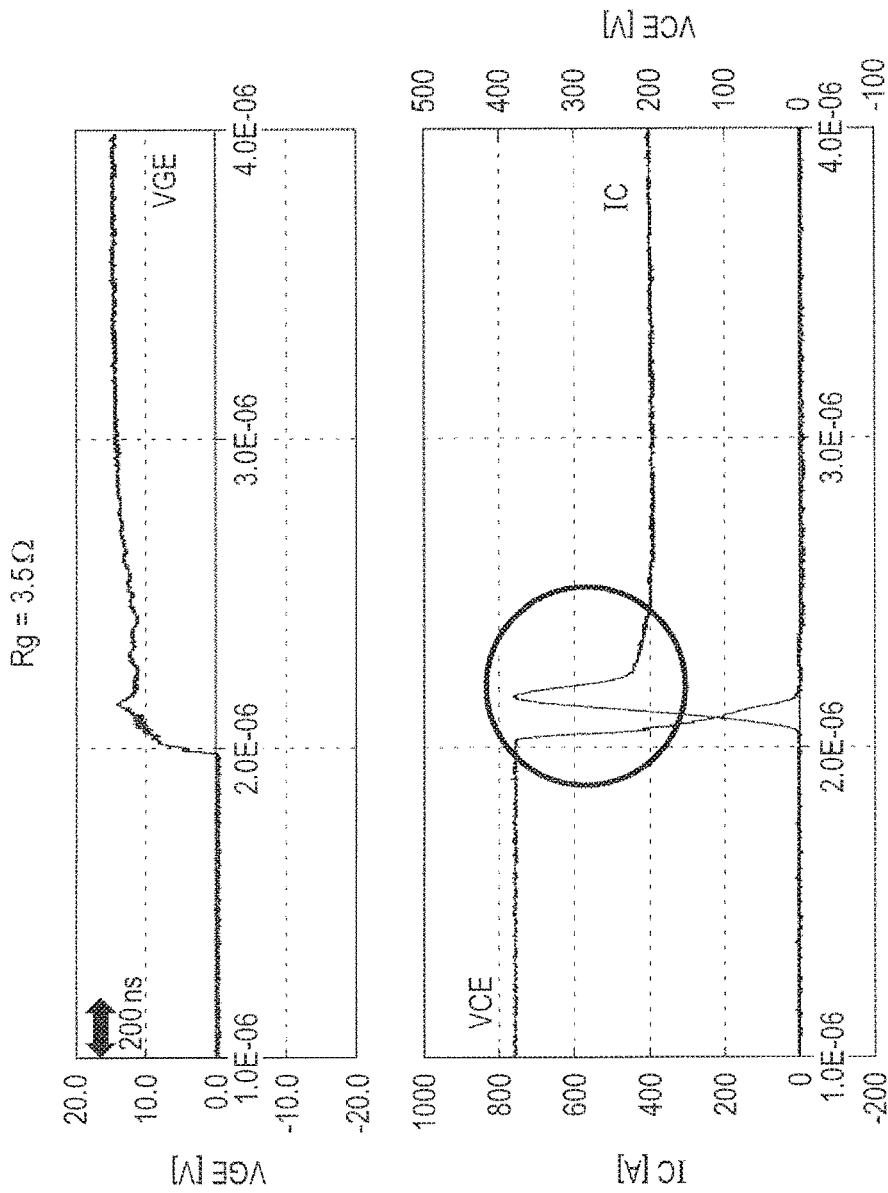
FIG. 38 is a waveform diagram illustrating one example of signals at turning-on of the IGBT (Rg=about 3.5Ω).
Figure 39:
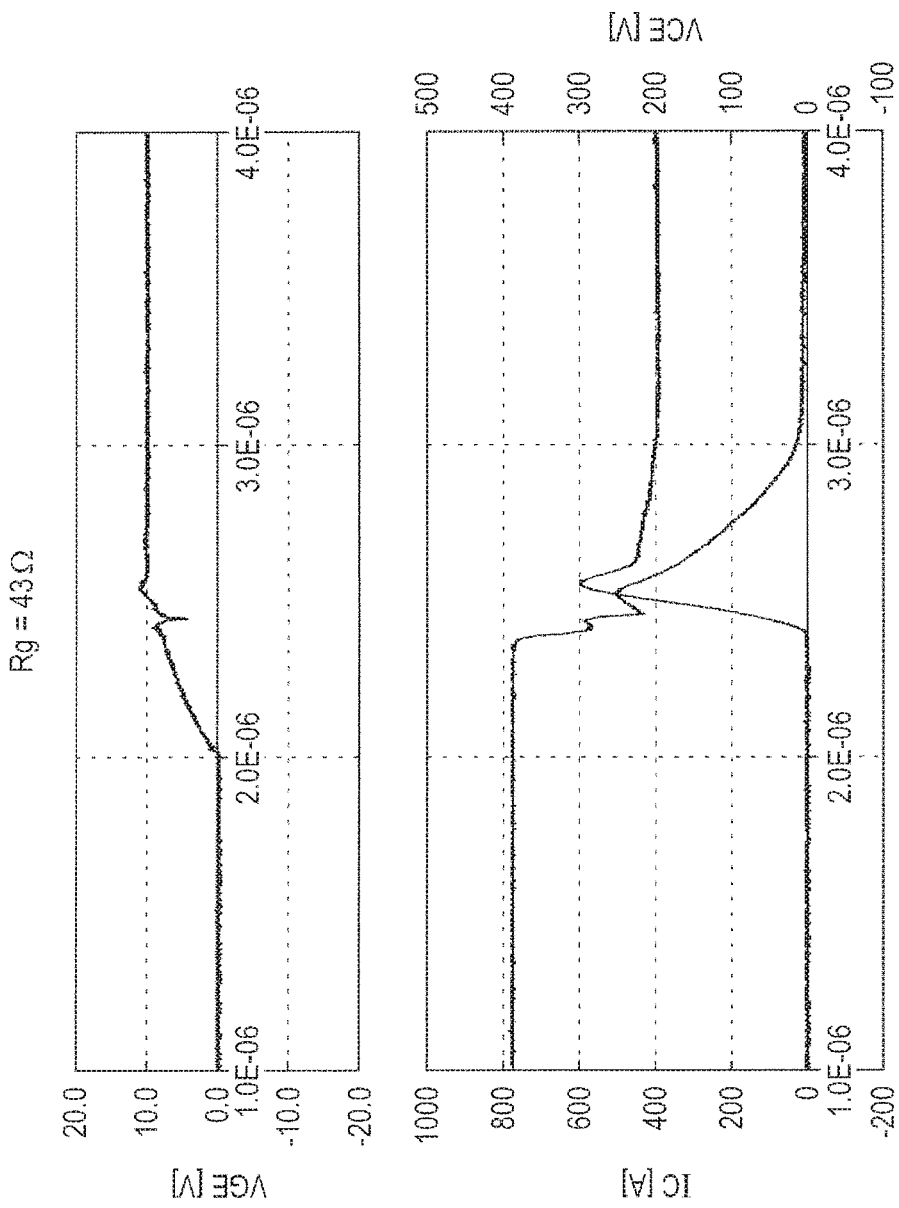
FIG. 39 is a waveform diagram illustrating one example of signals at turning-on of the IGBT on (Rg=about 43Ω).
Figure 40:
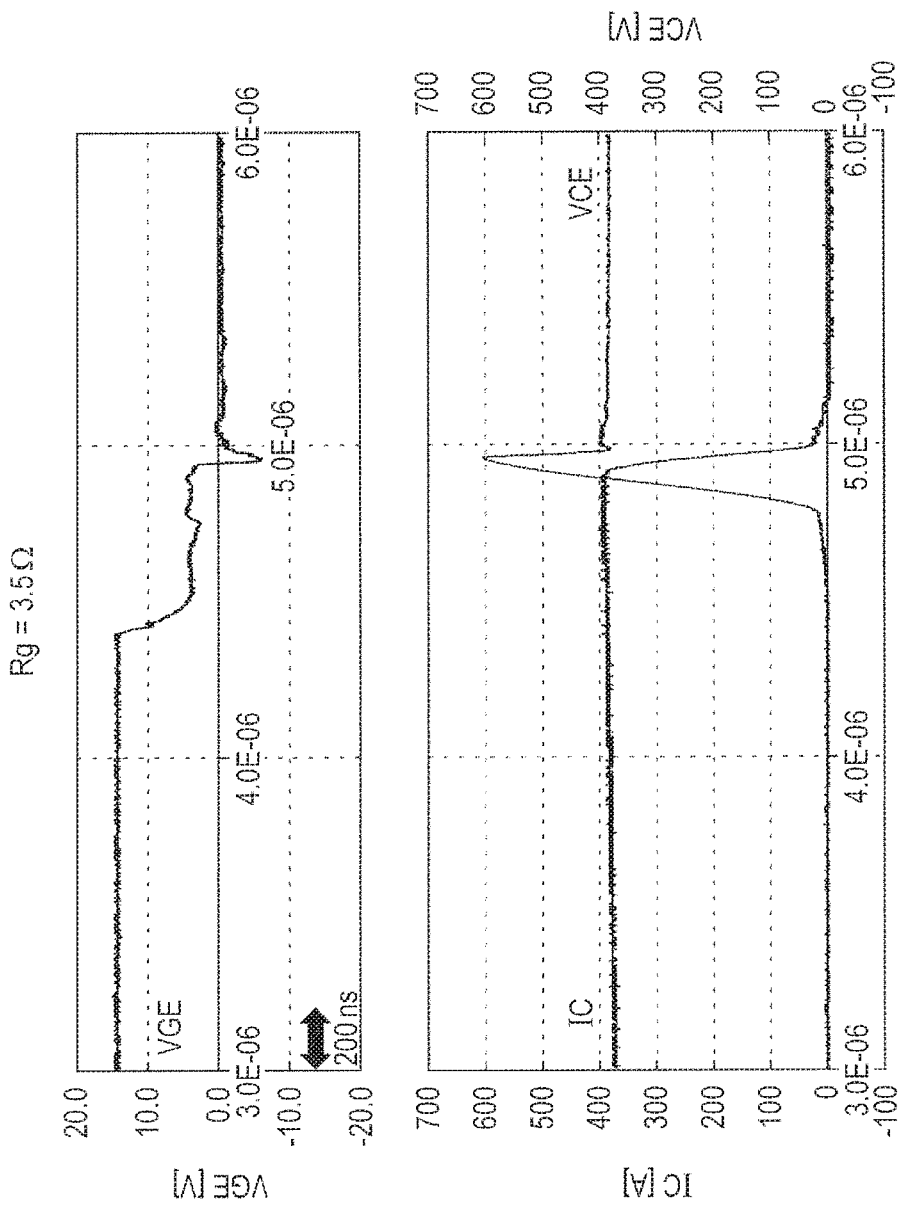
FIG. 40 is a waveform diagram illustrating one example of signals at turning-off of the IGBT (Rg=about 3.5Ω).
Figure 41:
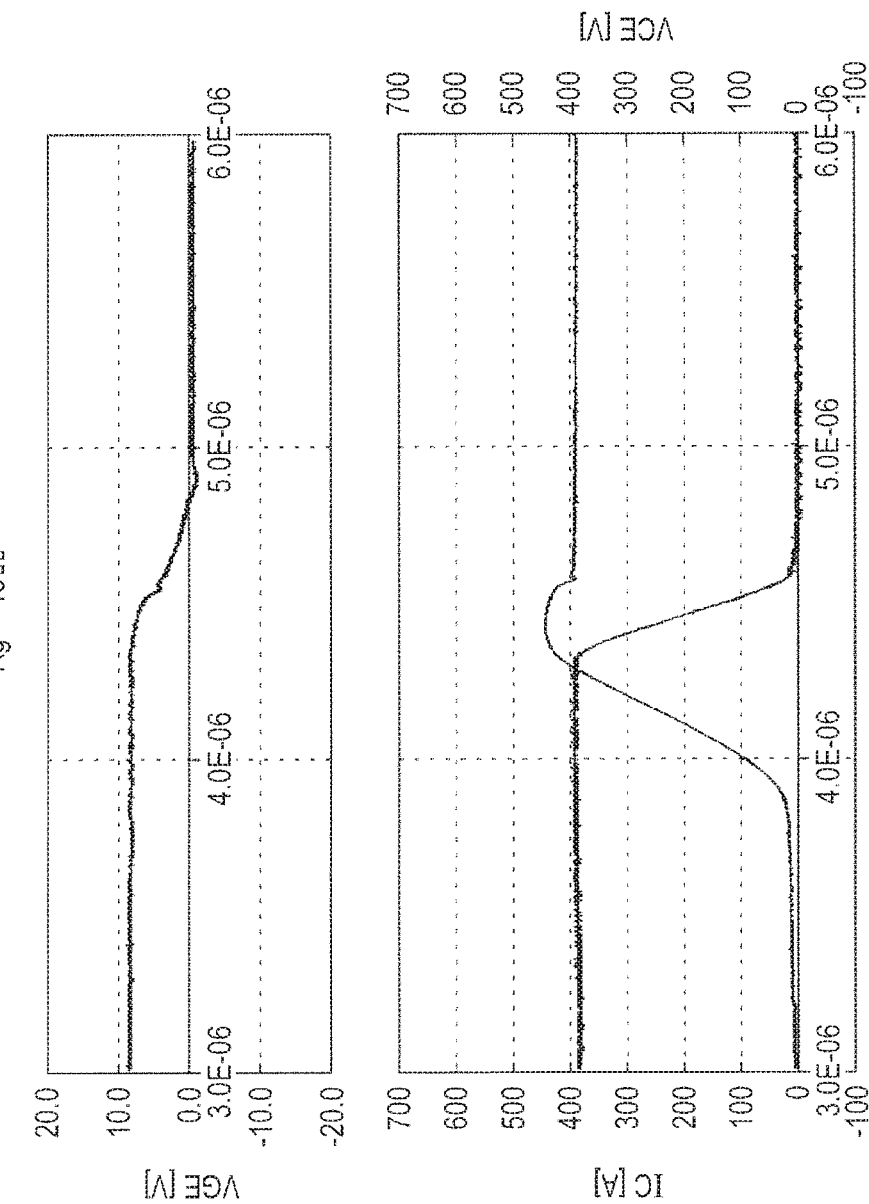
FIG. 41 is a waveform diagram illustrating one example of signals at turning-off the IGBT (Rg=about 43Ω).
Figure 42:
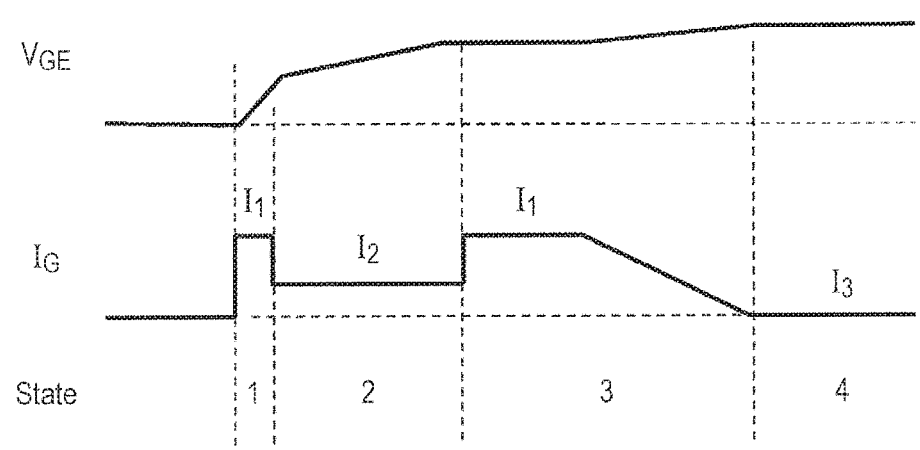
FIG. 42 is a waveform diagram illustrating one example of signal waveforms and the states at turning-on of the IGBT.

The countermeasures to the transient response will be described by using FIG. 38 to FIG. 43. FIG. 38 is a diagram illustrating one example of waveforms at turning-on (Re=about 3.5Ω). FIG. 39 is a diagram illustrating one example of waveforms at turning-on (Re=about 43Ω). FIG. 40 is a diagram illustrating one example of waveforms at turning-off (Re=about 3.5Ω). FIG. 41 is a diagram illustrating one example of waveforms at turning-off (Re=about 43Ω). FIG. 42 is a diagram illustrating one example of waveforms and the states at turning-on. FIG. 43 is a diagram illustrating drive control examples using data in the base data memory 213. Incidentally, "Address" and "IGBT State" are not stored in the base data memory 213.

As illustrated in FIG. 38 to FIG. 41, in a case where responsiveness is improved, speeding-up of operations is promoted by making the gate resistor (Rg) small. However, overshoot of the collector current (Ic) occurs with ease and occurrence of the overshoot leads to increases in noise and switching loss.

Accordingly, it is possible to prevent occurrence of the overshoot by shaping the signal into a waveform of reducing the current drive capability in the state (State3) directly before a saturation state when turning a gate driving current ($I_G$) on and in the state (State7) directly before the saturation state when turning the gate driving current ($I_G$) off.

For example, the driving current ($I_G$) in each state at turned-on (setting of the base data memory 213) is set as follows.

The first state (State1): The driving current is set to a maximum ($I_G=I_1$). For example, as illustrated in FIG. 43, "High side" data is set to "000000" and "Low side" data is set to "000000" in the addresses (Address) 0 to L-1 of the base data memory 213.

The second state (State2) : Setting is made in a manner that the current drive capability is restricted ($I_G=I_2<I_1$). For example, as illustrated in FIG. 43, the "High side" data is set to "110000" and the "Low side" data is set to "000000" in the addresses (Address) L to M-1 of the base data memory 213. The current drive capability is decreased with increasing the number of "1s" in the "High side" data.

The third state (State3): Setting is made in a manner that the current drive capability is temporarily increased and then is gradually decreased such that no overshoot occurs ($I_G=I_1 \rightarrow I_3$). For example, as illustrated in FIG. 43, the current drive capability is gradually decreased by setting the "High side" data in the addresses (Address) M to N-n to "000000", setting the "High side" data in the address (Address) N-2 to "111100", setting the "High side" data in the address (Address) N-1 to "111101" and setting the "High side" data in the address (Address) N to "111110". The "Low side" data in the addresses (Address) M to N is set to "000000".

The fourth state (State4): The current drive capability is set to the value ($I_G=I_3$) for maintaining the lowest on-state. For example, the "High side" data is set to "111100" and the "Low side" data is set to "000000" in the base data memory 213.

Although in the foregoing, the disclosure which has been made by the inventors and others has been specifically described on the basis of the embodiments, the present disclosure is not limited to the above-mentioned embodiments and it goes without saying that various alterations and modifications are possible within a range not deviating from the gist thereof.

What is claimed is:
1. A semiconductor device comprising:
   a drive control circuit which drives a gate terminal of an IGBT,
   wherein the drive control circuit includes
   a state machine control circuit which controls a state on the basis of rise and fall of a PWM signal from a semiconductor device for control,
   a base data memory which stores driving current information for rising and driving current information for falling,
   a current drive circuit which drives the IGBT on the basis of the driving current information stored in the base data memory, and
   an output terminal to which an output terminal of the current drive circuit is coupled, and
   wherein the state machine control circuit
   reads out the driving current information for rising which is stored in the base data memory a plurality of times in a predetermined time period and drives the current drive circuit at rising of the RWM signal, and
   reads out the driving current information for falling which is stored in the base data memory a plurality of times in a predetermined time period and drives the current drive circuit at falling of the PWM signal.
2. The semiconductor device according to claim 1,
   wherein the current drive circuit includes
   a plurality of transistors for rising which are coupled in parallel between a terminal to which a predetermined potential is applied and the output terminal, and
   a plurality of transistors for falling which are coupled in parallel between a terminal to which a reference poten- tial lower than the predetermined potential is applied and the output terminal, and
wherein the driving current information is information
as to which one of the transistors for rising is to be turned on, and
as to which one of the transistors for falling is to be turned on.

3. The semiconductor device according to claim 2,
wherein the base data memory is set in a manner that the driving current information for rising which is read out in the predetermined time period changes, and
wherein the base data memory is set in a manner that the driving current information for falling which is read out in the predetermined time period changes.

4. The semiconductor device according to claim 2,
wherein a plurality of the drive control circuits are arranged, and
wherein each of the drive control circuits drives each of the gate terminals of a plurality of the IGBTs which are coupled in parallel with one another.

5. The semiconductor device according to claim 4,
wherein in a case where rising characteristics of gate terminal voltages are made different from one another due to different gate threshold voltages of the IGBTs, the driving current information for rising which is read out in the predetermined time period is adjusted to bring the rising characteristics of the gate terminal voltages of the IGBTs close to one another.

6. The semiconductor device according to claim 4,
wherein in a case where falling characteristics of gate terminal voltages are made different from one another due to different gate threshold voltages of the IGBTs, the driving current information for falling which is read out in the predetermined time period is adjusted to bring the falling characteristics of the gate terminal voltages of the IGBTs close to one another.

7. A power conversion apparatus comprising:
a first IGBT and a second IGBT which are coupled in parallel with each other;
a semiconductor device; and
a semiconductor device for control including a memory,
wherein the semiconductor device includes
a first drive control circuit which drives the first IGBT,
a second drive control circuit which drives the second IGBT,
a first current monitor circuit which detects a driving current of the first IGBT,
a second current monitor circuit which detects a driving current of the second IGBT, and
a voltage monitor circuit which detects a driving voltage of each of the first IGBT and the second IGBT,
wherein each of the first drive control circuit and the second drive control circuit includes
a state machine control circuit which controls an operation mode on the basis of a command from the semiconductor device for control,
a base data memory which stores driving current information, and
a current drive circuit which drives each of the first IGBT and the second IGBT on the basis of the driving current information stored in the base data memory,
wherein the semiconductor device for control sets the semiconductor device to a first operation mode, makes the first and second drive control circuits acquire characteristics of the first IGBT and second IGBT by using the first or second current monitor circuit and the voltage monitor circuit and stores the acquired characteristics of the first IGBT and second IGBT into the memory,
wherein the semiconductor device for control calculates driving current information in a manner that a deviation between characteristics of the first IGBT and second IGBT is reduced on the basis of the characteristics of the first IGBT and the second IGBT which are stored in the memory and stores the calculated driving current information into the respective base data memories of the first drive control circuit and the second drive control circuit, and
wherein the semiconductor device for control sets the semiconductor device to a second operation mode and makes each of the first drive control circuit and the second drive control circuit drive each of the first IGBT and the second IGBT on the basis of the driving current information which is stored in the base data memory of each of the first drive control circuit and the second drive control circuit.

8. The power conversion apparatus according to claim 7,
wherein a drive capability of the current drive circuit in the first operation mode is smaller than a drive capability in the second operation mode.

9. The power conversion apparatus according to claim 8,
wherein in a case where the semiconductor device is in the first operation mode,
the first drive control circuit detects a timing of transition from a state of charging a gate circuit capacity of the first IGBT to an ON-state after completion of charging of the gate circuit capacity and a timing of transition from a state of discharging the gate circuit capacity of the first IGBT to an OFF-state after completion of discharging of the gate circuit capacity and holds the timings in a first register as time information, and
the second drive control circuit detects a timing of transition from a state of charging a gate circuit capacity of the second IGBT to the ON-state after completion of charging of the gate circuit capacity and a timing of transition from a state of discharging the gate circuit capacity of the second IGBT to the OFF-state after completion of discharging of the gate circuit capacity and holds the timings in a second register as time information.

10. The power conversion apparatus according to claim 9,
wherein in a case where the semiconductor device is in the first operation mode,
the semiconductor device for control
stores contents of the first register and the second register into the memory, and
calculates driving current information in a manner that a deviation between characteristics of the first IGBT and the second IGBT is reduced on the basis of the contents of the first register and the second register which are stored in the memory and stores the calculated driving current information into the base data memories of the first drive control circuit and the second drive control circuit.

11. The power conversion apparatus according to claim 10,
wherein the state machine control circuit drives the current drive circuit on the basis of a clock signal.

12. The power conversion apparatus according to claim 10, further comprising:
a time measurement circuit which acquires time information corresponding to gate threshold values of the first IGBT and the second IGBT on the basis of a result of detection by the first current monitor circuit, the second current monitor circuit or the voltage monitor circuit, wherein the time measurement circuit counts the clock signal when a start signal is activated and stops counting when a stop signal is activated, and wherein the stop signal is a detection signal of the first current monitor circuit, the second current monitor circuit or the voltage monitor circuit.

13. The power conversion apparatus according to claim 7, wherein in a case where the semiconductor device is in a second operation mode, the state machine control circuit reads out the driving current information for rising which is stored in the base data memory a plurality of times in a predetermined time period and drives the current drive circuit at rising of the RWM signal, and reads out the driving current information for falling which is stored in the base data memory a plurality of times in a predetermined time period and drives the current drive circuit at falling of the PWM signal.

14. The power conversion apparatus according to claim 13, wherein the current drive circuit includes a plurality of transistors for rising which are coupled in parallel between a terminal to which a predetermined potential is applied and the output terminal, and a plurality of transistors for falling which are coupled in parallel between a terminal to which a reference potential lower than the predetermined potential is applied and the output terminal, and wherein the driving current information is information as to which one of the transistors for rising is to be turned on, and as to which one of the transistors for falling is to be turned on.

15. The power conversion apparatus according to claim 14, wherein in a case where rising characteristics of gate terminal voltages are made different from one another due to different gate threshold voltages of the IGBTs, the driving current information for rising which is read out in the predetermined time period is adjusted to bring the rising characteristics of the gate terminal voltages of the IGBTs close to one another.

16. The power conversion apparatus according to claim 15, wherein in a case where falling characteristics of gate terminal voltages are made different from one another due to different gate threshold voltages of the IGBTs, the driving current information for falling which is read out in the predetermined time period is adjusted to bring the falling characteristics of the gate terminal voltages of the IGBTs close to one another.

* * * * *